(12) United States Patent
Wang et al.

(10) Patent No.: US 9,496,442 B2
(45) Date of Patent: Nov. 15, 2016

(54) SOLAR MODULES INCLUDING SPECTRAL CONCENTRATORS AND RELATED MANUFACTURING METHODS

(75) Inventors: Jian Jim Wang, Orefield, PA (US); Nemanja Vockic, San Jose, CA (US); William Matthew Pfenninger, Fremont, CA (US); John Kenney, Palo Alto, CA (US)

(73) Assignee: OMNIPV, San Carlos, CA (US)

( * ) Notice: Subject to any disclaimer, the term of this patent is extended or adjusted under 35 U.S.C. 154(b) by 1612 days.

(21) Appl. No.: 12/691,697

(22) Filed: Jan. 21, 2010

(65) Prior Publication Data

US 2010/0180932 A1 Jul. 22, 2010

Related U.S. Application Data

(60) Provisional application No. 61/146,595, filed on Jan. 22, 2009.

(51) Int. Cl.
*H01L 31/0232* (2014.01)
*H01L 31/055* (2014.01)
*C09K 11/00* (2006.01)
*C09K 11/08* (2006.01)
*C09K 11/66* (2006.01)
*H01L 31/054* (2014.01)

(52) U.S. Cl.
CPC ......... *H01L 31/055* (2013.01); *H01L 31/0547* (2014.12); *Y02E 10/52* (2013.01)

(58) Field of Classification Search
CPC ........... H01L 31/02322; H01L 31/055; B32B 2307/422
USPC ......... 427/370; 136/247; 156/67; 250/484.4, 250/486.1
See application file for complete search history.

(56) References Cited

U.S. PATENT DOCUMENTS

| | | | | |
|---|---|---|---|---|
| 3,912,931 | A | * | 10/1975 | Gravisse et al. .......... 250/458.1 |
| 4,188,239 | A | * | 2/1980 | Boling .......................... 136/247 |
| 6,352,875 | B1 | * | 3/2002 | Hayashi et al. ................ 438/67 |
| 2004/0123895 | A1 | * | 7/2004 | Kardauskas et al. ......... 136/244 |
| 2008/0014463 | A1 | * | 1/2008 | Varadarajan et al. ........ 428/690 |
| 2009/0056791 | A1 | * | 3/2009 | Pfenninger et al. .. H01L 31/055 136/247 |
| 2009/0101201 | A1 | * | 4/2009 | White et al. .................. 136/255 |

FOREIGN PATENT DOCUMENTS

| | | |
|---|---|---|
| WO | WO00/54340 | 9/2000 |
| WO | WO03/079457 | 9/2003 |
| WO | WO2008/099039 | 8/2008 |
| WO | WO2009/002943 | 12/2008 |

OTHER PUBLICATIONS

Groner et al. "Electrical characterization of thin A12O3 films grown by atomic layer deposition on silicon and various metal substrates" Thin Solid Films 413 (2002) 186-197.*
PCT/US2010/021724, Applicant: OMNIPV, Inc., et al., International Search Report (Aug. 31, 2010).

* cited by examiner

*Primary Examiner* — Magali P Slawski
(74) *Attorney, Agent, or Firm* — Foley & Lardner LLP; Cliff Z. Liu

(57) ABSTRACT

Described herein are solar modules including spectral concentrators and related manufacturing methods.

11 Claims, 9 Drawing Sheets

SOLAR MODULES INCLUDING SPECTRAL CONCENTRATORS AND RELATED MANUFACTURING METHODS

CROSS-REFERENCE TO RELATED APPLICATION

This application claims the benefit of U.S. Provisional Application Ser. No. 61/146,595, filed on Jan. 22, 2009, the disclosure of which is incorporated herein by reference in its entirety.

FIELD OF THE INVENTION

The invention relates generally to solar modules. More particularly, the invention relates to solar modules including spectral concentrators.

BACKGROUND

A solar module operates to convert energy from solar radiation into electricity, which is delivered to an external load to perform useful work. A solar module typically includes a set of photovoltaic ("PV") cells, which can be connected in parallel, in series, or a combination thereof. The most common type of PV cell is a p-n junction device based on crystalline silicon. Other types of PV cells can be based on amorphous silicon, polycrystalline silicon, germanium, organic materials, and Group 111-V semiconductor materials, such as gallium arsenide.

During operation of an existing solar module, incident solar radiation penetrates below a surface of the PV cell and is absorbed within the PV cell. A depth at which the solar radiation penetrates below the surface can depend upon an absorption coefficient of the PV cell. In the case of a PV cell based on silicon, an absorption coefficient of silicon varies with wavelength of solar radiation. For example, for solar radiation at 900 nm, silicon has an absorption coefficient of about 100 $cm^{-1}$, and the solar radiation can penetrate to a depth of about 100 µm. In contrast, for solar radiation at 450 nm, the absorption coefficient is greater at about $10^4$ $cm^{-1}$, and the solar radiation can penetrate to a depth of about 1 µm. At a particular depth within the PV cell, absorption of solar radiation produces charge carriers in the form of electron-hole pairs. Electrons exit the PV cell through one electrode, while holes exit the PV cell through another electrode. The net effect is a flow of an electric current through the PV cell driven by incident solar radiation. The inability to convert the total incident solar radiation to useful electrical energy represents a loss or inefficiency of the solar module.

Current solar modules typically suffer a number of technical limitations on the ability to efficiently convert incident solar radiation to useful electrical energy. One significant loss mechanism typically derives from a mismatch between an incident solar spectrum and an absorption spectrum of PV cells. In the case of a PV cell based on silicon, photons with energy greater than a bandgap energy of silicon can lead to the production of photo-excited electron-hole pairs with excess energy. Such excess energy is typically not converted into electrical energy but is rather typically lost as heat through hot charge carrier relaxation or thermalization. This heat can raise the temperature of the PV cell and, as result, can reduce the efficiency of the PV cell in terms of its ability to produce electron-hole pairs. In some instances, the efficiency of the PV cell can decrease by about 0.5 percent for every 1° C. rise in temperature. In conjunction with these thermalization losses, photons with energy less than the bandgap energy of silicon are typically not absorbed and, thus, typically do not contribute to the conversion into electrical energy. As a result, a small range of the incident solar spectrum near the bandgap energy of silicon can be efficiently converted into useful electrical energy.

Also, in accordance with a junction design of a PV cell, charge separation of electron-hole pairs is typically confined to a depletion region, which can be limited to a thickness of about 1 µm. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region can be desirable for solar radiation at one wavelength, the same depth can be undesirable for solar radiation at a shorter wavelength. In particular, since the shorter wavelength solar radiation can penetrate below the surface to a lesser degree, electron-hole pairs that are produced can be too far from the depletion region to contribute to an electric current.

It is against this background that a need arose to develop the solar modules and related manufacturing methods described herein.

SUMMARY

Embodiments of the invention relate to solar modules and related manufacturing methods. In one embodiment, a method of forming a solar module includes: (1) providing a first assembly of layers, the first assembly of layers including a first substrate layer, a first reflector adjacent to the first substrate layer, and a first coating adjacent to the first reflector, the first coating corresponding to a luminescent material and including a first surface facing away from the first reflector; (2) providing a second assembly of layers, the second assembly of layers including a second substrate layer, a second reflector adjacent to the second substrate layer, and a second coating adjacent to the second reflector, the second coating corresponding to the luminescent material and including a second surface facing away from the second reflector; (3) positioning the first assembly of layers and the second assembly of layers such that the first surface of the first coating and the second surface of the second coating face one another; and (4) bonding the first coating and the second coating to form a luminescent layer, the luminescent layer including the luminescent material and positioned between the first reflector and the second reflector.

In another embodiment, a method of forming a solar module includes: (1) providing a first assembly of layers, the first assembly of layers including a first substrate layer, a first reflector adjacent to the first substrate layer, and a luminescent layer adjacent to the first reflector, the luminescent layer including a first surface facing away from the first reflector; (2) providing a second assembly of layers, the second assembly of layers including a second substrate layer and a second reflector adjacent to the second substrate layer, the second reflector including a second surface facing away from the second substrate layer; (3) applying an adhesive material adjacent to at least one of the first surface of the luminescent layer and the second surface of the second reflector; (4) positioning the first assembly of layers and the second assembly of layers such that the adhesive material is between the luminescent layer and the second reflector; and (5) applying energy to the adhesive material to form a bonding layer connecting the luminescent layer and the second reflector.

In a further embodiment, a solar module includes: (1) a set of photovoltaic cells; and (2) a spectral concentrator optically connected to the set of photovoltaic cells and including a luminescent stack, the luminescent stack including: (a) a first reflector; (b) a second reflector; (c) a luminescent layer positioned between the first reflector and the second reflector, the luminescent layer configured to absorb incident solar radiation and emit substantially monochromatic radiation that is guided towards the set of photovoltaic cells; and (d) a bonding layer positioned between the luminescent layer and the second reflector, the bonding layer formed from an adhesive material and connecting the luminescent layer and the second reflector.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Overview

Figure 1:
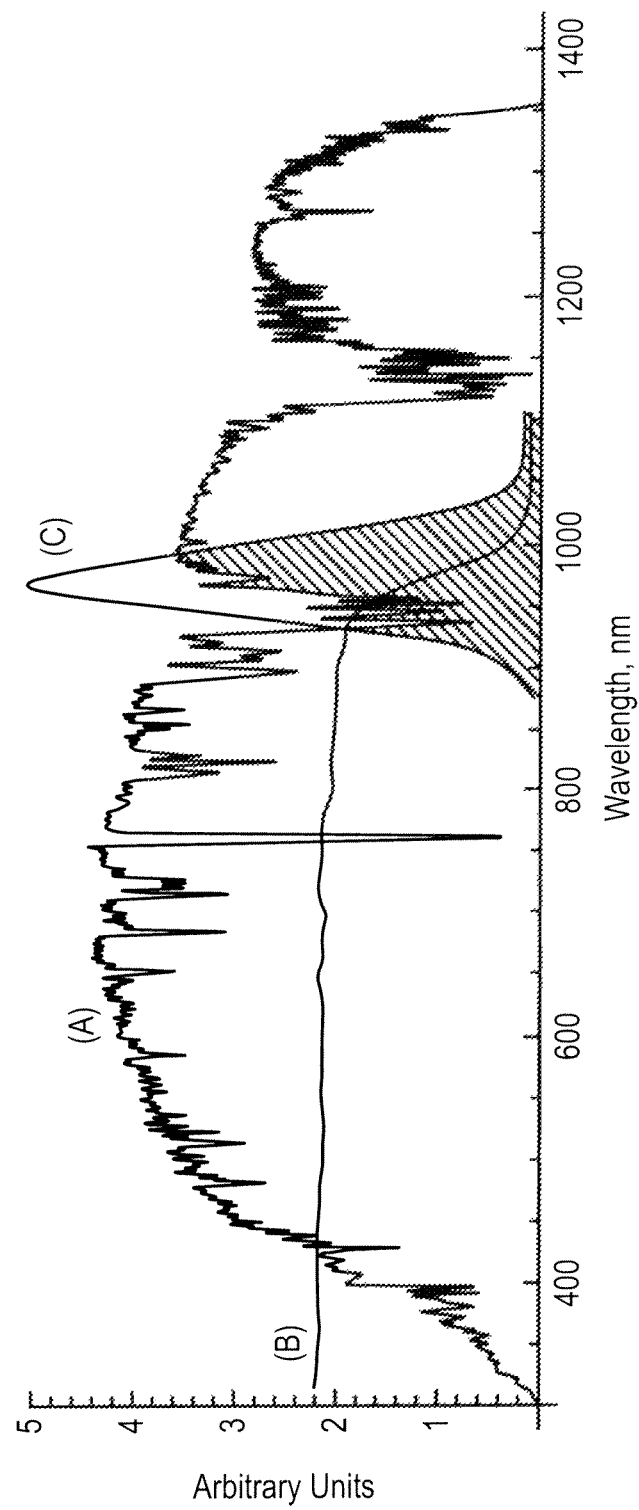
FIG. 1 illustrates a combined representation of an incident solar spectrum and measured absorption and emission spectra of UD-930 in accordance with an embodiment of the invention.

Embodiments of the invention relate to solar modules and related manufacturing methods. For some embodiments, a solar module includes a spectral concentrator and a set of PV cells that are optically coupled to the spectral concentrator. The spectral concentrator can perform a number of operations, including: (1) collecting incident solar radiation; (2) converting the incident solar radiation to substantially monochromatic radiation near a bandgap energy of the PV cells; and (3) conveying the converted radiation to the PV cells, where the converted radiation can be converted to useful electrical energy. By converting a wide range of energies of the incident solar radiation to a narrow band of energies matched to the bandgap energy of the PV cells, significant improvements in efficiency can be achieved. In addition, the design of the PV cells can be optimized or otherwise tailored based on this narrow band of energies. The solar module can be formed using reactive bonding or non-reactive bonding.

DEFINITIONS

The following definitions apply to some of the elements described with regard to some embodiments of the invention. These definitions may likewise be expanded upon herein.

As used herein, the singular terms "a," "an," and "the" include plural referents unless the context clearly dictates otherwise. Thus, for example, reference to a luminescent material can include multiple luminescent materials unless the context clearly dictates otherwise.

As used herein, the term "set" refers to a collection of one or more elements. Thus, for example, a set of layers can include a single layer or multiple layers. Elements of a set can also be referred to as members of the set. Elements of a set can be the same or different. In some instances, elements of a set can share one or more common characteristics.

As used herein, the term "adjacent" refers to being near or adjoining. Adjacent elements can be spaced apart from one another or can be in actual or direct contact with one another. In some instances, adjacent elements can be connected to one another or can be formed integrally with one another.

As used herein, the terms "connect," "connected," and "connection" refer to an operational coupling or linking. Connected elements can be directly coupled to one another or can be indirectly coupled to one another, such as via another set of elements.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein.

As used herein, the terms "optional" and "optionally" mean that the subsequently described event or circumstance may or may not occur and that the description includes instances where the event or circumstance occurs and instances in which it does not.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to a relative orientation of a set of elements, such as in accordance with the drawings, but do not require a particular orientation of those elements during manufacturing or use.

As used herein, the term "ultraviolet range" refers to a range of wavelengths from about 5 nanometer ("nm") to about 400 nm.

As used herein, the term "visible range" refers to a range of wavelengths from about 400 nm to about 700 nm.

As used herein, the term "infrared range" refers to a range of wavelengths from about 700 nm to about 2 millimeter ("mm"). The infrared range includes the "near infrared range," which refers to a range of wavelengths from about 700 nm to about 5 micrometer ("μm"), the "middle infrared range," which refers to a range of wavelengths from about 5 μm to about 30 μm, and the "far infrared range," which refers to a range of wavelengths from about 30 μm to about 2 mm.

As used herein, the terms "reflection," "reflect," and "reflective" refer to a bending or a deflection of light, and the term "reflector" refers to an object that causes, induces, or is otherwise involved in such bending or deflection. A bending or a deflection of light can be substantially in a single direction, such as in the case of specular reflection, or can be in multiple directions, such as in the case of diffuse reflection or scattering. In general, light incident upon a material and light reflected from the material can have wavelengths that are the same or different.

As used herein, the terms "luminescence," "luminesce," and "luminescent" refer to an emission of light in response to an energy excitation. Luminescence can occur based on relaxation from excited electronic states of atoms or molecules and can include, for example, chemiluminescence, electroluminescence, photoluminescence, thermoluminescence, triboluminescence, and combinations thereof. Luminescence can also occur based on relaxation from excited states of quasi-particles, such as excitons, bi-excitons, and exciton-polaritons. For example, in the case of photoluminescence, which can include fluorescence and phosphorescence, an excited electronic state can be produced based on a light excitation, such as absorption of light. In general, light incident upon a material and light emitted by the material can have wavelengths that are the same or different.

As used herein with respect to photoluminescence, the term "quantum efficiency" refers to a ratio of the number of output photons to the number of input photons. Quantum efficiency of a photoluminescent material can be characterized with respect to its "internal quantum efficiency," which refers to a ratio of the number of photons emitted by the photoluminescent material to the number of photons absorbed by the photoluminescent material. In some instances, a photoluminescent material can be included within a structure that is exposed to solar radiation, and the structure can direct, guide, or propagate emitted light towards a PV cell. In such instances, another characterization of quantum efficiency can be an "external quantum efficiency" of the structure, which refers to a ratio of the number of photons that reach the PV cell to the number of solar photons that are absorbed by the photoluminescent material within the structure. Alternatively, quantum efficiency of the structure can be characterized with respect to its "overall external quantum efficiency," which refers to a ratio of the number of photons that reach the PV cell to the number of solar photons that are incident upon the structure. As can be appreciated, an overall external quantum efficiency of a structure can account for potential losses, such as reflection, that reduce the fraction of incident solar photons that can reach a photoluminescent material. A further characterization of quantum efficiency can be an "energy quantum efficiency," in which the various ratios discussed above can be expressed in terms of ratios of energies, rather than ratios of numbers of photons. An energy-based quantum efficiency can be less than its corresponding photon number-based quantum efficiency in the event of down-conversion, namely if a higher energy photon is absorbed and converted to a lower energy emitted photon.

As used herein, the term "absorption spectrum" refers to a representation of absorption of light over a range of wavelengths. In some instances, an absorption spectrum can refer to a plot of absorbance (or transmittance) of a material as a function of wavelength of light incident upon the material.

As used herein, the term "emission spectrum" refers to a representation of emission of light over a range of wavelengths. In some instances, an emission spectrum can refer to a plot of intensity of light emitted by a material as a function of wavelength of the emitted light.

As used herein, the term "excitation spectrum" refers to another representation of emission of light over a range of wavelengths. In some instances, an excitation spectrum can refer to a plot of intensity of light emitted by a material as a function of wavelength of light incident upon the material.

As used herein, the term "Full Width at Half Maximum" or "FWHM" refers to a measure of spectral width. In the case of an emission spectrum, a FWHM can refer to a width of the emission spectrum at half of a peak intensity value.

As used herein with respect to an absorption spectrum or an excitation spectrum, the term "substantially flat" refers to being substantially invariant with respect to a change in wavelength. In some instances, a spectrum can be referred to as being substantially flat over a range of wavelengths if absorbance or intensity values within that range of wavelengths exhibit a standard deviation of less than 20 percent with respect to an average intensity value, such as less than 10 percent or less than 5 percent.

As used herein with respect to an emission spectrum, the term "substantially monochromatic" refers to emission of light over a narrow range of wavelengths. In some instances, an emission spectrum can be referred to as being substantially monochromatic if a spectral width is no greater than 120 nm at FWHM, such as no greater than 100 nm at FWHM, no greater than 80 nm at FWHM, or no greater than 50 nm at FWHM.

As used herein, the term "nanometer range" or "nm range" refers to a range of dimensions from about 1 nm to about 1 μm. The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 μm.

As used herein, the term "micrometer range" or "μm range" refers to a range of dimensions from about 1 μm to about 1 mm. The μm range includes the "lower μm range," which refers to a range of dimensions from about 1 μM to about 10 μm, the "middle μm range," which refers to a range of dimensions from about 10 μm to about 100 μm, and the "upper μm range," which refers to a range of dimensions from about 100 μm to about 1 mm.

As used herein, the term "size" refers to a characteristic dimension of an object. In the case of an object that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. Alternatively, or in conjunction, a size of a non-spherical object can refer to an average of various orthogonal dimensions of the object. Thus, for example, a size of an object that is a spheroidal can refer to an average of a major axis and a minor axis of the object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

As used herein, the term "nanoparticle" refers to a particle that has a size in the nm range. A nanoparticle can have any of a variety of shapes, such as box-shaped, cube-shaped, cylindrical, disk-shaped, spherical, spheroidal, tetrahedral, tripodal, tube-shaped, pyramid-shaped, or any other regular or irregular shape, and can be formed from any of a variety of materials. In some instances, a nanoparticle can include a core formed from a first material, which core can be optionally surrounded by a coating or a shell formed from a second material. The first material and the second material can be the same or different. Depending on the configuration of a nanoparticle, the nanoparticle can exhibit size dependent characteristics associated with quantum confinement. However, it is also contemplated that a nanoparticle can substantially lack size dependent characteristics associated with quantum confinement or can exhibit such size dependent characteristics to a low degree.

As used herein, the term "dopant" refers to a chemical entity that is present in a material as an additive or an impurity. In some instances, the presence of a dopant in a material can alter a set of characteristics of the material, such as its chemical, magnetic, electronic, or optical characteristics.

Luminescent Materials

A variety of luminescent materials can be used to form the solar modules described herein. Examples include organic fluorophors, inorganic fluorophors and phosphors, nanoparticles, and semiconductor materials.

Inorganic fluorophors having optical transitions in the range of about 900 nm to about 980 nm can be suitable for use with PV cells based on silicon. An inorganic fluorophor having a suitable emission wavelength can be selected based on an atomic moiety involved. For example, inorganic fluorophors with luminescence derived from transition or rare earth atoms can be used. Other examples of inorganic fluorophors include oxides or chalcoginides with luminescence derived from a defect state in a crystal. Inorganic phosphors can also be suitable for use with PV cells based on silicon.

Nanoparticles, such as nanoparticles formed from silicon or germanium, can be useful for spectral concentration. The nanoparticles can be formed as self-assembled nanoparticles, such as by vacuum deposition, or as discrete nanoparticles, such as in a colloidal solution. The nanoparticles can be formed with a high internal quantum efficiency for photoluminescence by reducing defect density, typically to less than one defect per nanoparticle. In addition, surfaces of the nanoparticles can be properly terminated to enhance the photoluminescence. Emission wavelength of the nanoparticles can be dependent upon, or controlled by, their sizes. A narrow distribution of sizes can be desirable, so that a resulting spectral width is narrow, and there is reduced self-absorption of emitted light from smaller-sized nanoparticles by larger-sized nanoparticles.

Semiconductor materials, such as indium phosphide or InP, with a bandgap energy that is near and slightly above the bandgap energy of PV cells can also be used. In particular, semiconductor materials with a bandgap energy in the range of about 1.1 eV to about 1.5 eV, such as from about 1.2 eV to about 1.4 eV, at 300K can be suitable as spectral concentrators for PV cells based on silicon.

For example, indium phosphide has a direct, allowed bandgap energy of about 1.35 eV and an absorption coefficient of about $10^5$ $cm^{-1}$. Indium phosphide, or another semiconductor material, can be deposited as a film in a single layer or in multiple layers interspersed with other layers. The other layers can be included for optical and efficiency purposes and for chemical and environmental protection, such as silica and alumina as hermetic sealants.

The absorption coefficient of indium phosphide, or another semiconductor material, in the optical wavelengths of the solar spectrum can be in the range of about $10^4$ $cm^{-1}$ or greater at energies larger than the bandgap edge. A film thickness in the micrometer range, such as a few micrometers or less, can have an optical density of 2 or more to allow at least about 99 percent of incident solar radiation to be absorbed. Indium phosphide, or another semiconductor material, can also be deposited into porous matrices or deposited as nanoparticles. For example, indium phosphide can be formed as nanoparticles and dispersed in a matrix such as an optically stable polymer or an inorganic glass. The total amount of absorbing semiconductor material can be equivalent to an optical density of 2 or more to allow at least about 99 percent of incident solar radiation to be absorbed. Use of a resonant cavity structure allows the efficient use of semiconductor materials in the form of thin films. Furthermore, the resonant cavity structure, by modification of a radiation matrix, allows the use of semiconductor materials with forbidden optical transitions and indirect optical transitions in the desired wavelength range for spectral concentration. Lower bandgap energy materials can also be made to luminesce by quantum confinement, either in thin films or by formation of nanoparticles.

A new class of luminescent materials is disclosed in co-owned U.S. Pat. No. 7,641,815, entitled "Luminescent Materials that Emit Light in the Visible Range or the Near Infrared Range" and issued on Jan. 5, 2010, the disclosure of which is incorporated herein by reference in its entirety. This class of luminescent materials includes semiconductor materials that can be represented with reference to the formula:

$$[A_a B_b X_x][\text{dopants}] \quad (I)$$

In formula (I), A is selected from elements of Group IA, such as sodium (e.g., as Na(I) or $Na^{1+}$), potassium (e.g., as K(I) or $K^{1+}$), rubidium (e.g., as Rb(I) or $Rb^{1+}$), and cesium (e.g., as Cs(I) or $Cs^{1+}$); B is selected from elements of Group VA, such as vanadium (e.g., as V(III) or $V^{+3}$), elements of Group IB, such as copper (e.g., as Cu(I) or $Cu^{+1}$), silver (e.g., as Ag(I) or $Ag^{+1}$), and gold (e.g., as Au(I) or $Au^{+1}$), elements of Group JIB, such as zinc (e.g., as Zn(II) or $Zn^{+2}$), cadmium (e.g., as Cd(II) or $Cd^{+2}$), and mercury (e.g., as Hg(II) or $Hg^{+2}$), elements of Group MB, such as gallium (e.g., as Ga(I) or $Ga^{+1}$), indium (e.g., as In(I) or $In^{+1}$), and thallium (e.g., as Tl(I) or $Tl^{+1}$), elements of Group IVB, such as germanium (e.g., as Ge(II) or $Ge^{+2}$ or as Ge(IV) or $Ge^{+4}$), tin (e.g., as Sn(II) or $Sn^{+2}$ or as Sn(IV) or $Sn^{+4}$), and lead (e.g., as Pb(II) or $Pb^{+2}$ or as Pb(IV) or $Pb^{+4}$), and elements of Group VB, such as bismuth (e.g., as Bi(III) or $Bi^{+3}$); and X is selected from elements of Group VIIB, such as fluorine (e.g., as $F^{-1}$), chlorine (e.g., as $Cl^{-1}$), bromine (e.g., as $Br^{-1}$), and iodine (e.g., as $I^{-1}$). Still referring to formula (I), a is an integer that can be in the range of 1 to 12, such as from 1 to 9 or from 1 to 5; b is an integer that can be in the range of 1 to 8, such as from 1 to 5 or from 1 to 3; and x is an integer that can be in the range of 1 to 12, such as from 1 to 9 or from 1 to 5. In some instances, x can be equal to a+2b. For example, a can be equal to 1, and x can be equal to 1+2b. It is also contemplated that one or more of a, b, and x can have fractional values within their respective ranges. It is further contemplated that $X_x$ in formula (I) can be more generally represented as $X_x X'_{x'}$ (or $X_x X'_{x'} X''_{x''}$), where X and X' (or X, X', and X") can be independently selected from elements of Group VIIB, and the sum of x and x' (or the sum of x, x', and x") can be in the range of 1 to 12, such as from 1 to 9 or from 1 to 5. With reference to the generalized version of formula (I), the sum of x and x' (or the sum of x, x and x") can be equal to a+2b. For example, a can be equal to 1, and the sum of x and x' (or the sum of x, x', and x") can be equal to 1+2b. Dopants can be optionally included in a luminescent material represented by formula (I), and can be present in amounts that are less than about 5 percent, such as less than about 1 percent, in terms of elemental composition. The dopants can derive from reactants that are used to form the luminescent material. In particular, the dopants can include cations and anions, which form electron acceptor/electron donor pairs that are dispersed within a microstructure of the luminescent material.

Luminescent materials represented by formula (I) can be formed via reaction of a set of reactants at high yields and at moderate temperatures and pressures. The reaction can be represented with reference to the formula:

$$\text{Source}(B) + \text{Source}(A_tX) \rightarrow \text{Luminescent Material} \qquad (II)$$

In formula (II), source(B) serves as a source of B, and, in some instances, source(B) can also serve as a source of dopants. In the case that B is germanium, tin, or lead, for example, source(B) can include one or more types of B-containing compounds selected from B(II) compounds of the form $BY$, $BY_2$, $B_3Y_2$, and $B_2Y$ and B(IV) compounds of the form $BY_4$, where Y can be selected from elements of Group VIB, such as oxygen (e.g., as $O^{-2}$); elements of Group VIIB, such as fluorine (e.g., as $F^{-1}$), chlorine (e.g., as $Cl^{-1}$), bromine (e.g., as $Br^{-1}$), and iodine (e.g., as $I^{-1}$); and polyelemental chemical entities, such as nitrate (i.e., $NO_3^{-1}$), thiocyanate (i.e., $SCN^{-1}$), hypochlorite (i.e., $OCl^{-1}$), sulfate (i.e., $SO_4^{-2}$), orthophosphate (i.e., $PO_4^{-3}$), metaphosphate (i.e., $PO_3^{-1}$), oxalate (i.e., $C_2O_4^{-2}$), methanesulfonate (i.e., $CH_3SO_3^{-1}$), trifluoromethanesulfonate (i.e., $CF_3SO_3^{-1}$), and pyrophosphate (i.e., $P_2O_7^{-4}$). Examples of tin(II) compounds include tin(II) fluoride (i.e., $SnF_2$), tin(II) chloride (i.e., $SnCl_2$), tin(II) chloride dihydrate (i.e., $SnCl_2.2H_2O$), tin(II) bromide (i.e., $SnBr_2$), tin(II) iodide (i.e., $SnI_2$), tin(II) oxide (i.e., SnO), tin(II) sulfate (i.e., $SnSO_4$), tin(II) orthophosphate (i.e., $Sn_3(PO_4)_2$), tin(II) metaphosphate (i.e., $Sn(PO_3)_2$), tin(II) oxalate (i.e., $Sn(C_2O_4)$), tin(II) methanesulfonate (i.e., $Sn(CH_3SO_3)_2$), tin(II) pyrophosphate (i.e., $Sn_2P_2O_7$), and tin(II) trifluoromethanesulfonate (i.e., $Sn(CF_3SO_3)_2$). Examples of tin(IV) compounds include tin(IV) chloride (i.e., $SnCl_4$), tin(IV) iodide (i.e., $SnI_4$), and tin(IV) chloride pentahydrate (i.e., $SnCl_4.5H_2O$). It is contemplated that different types of source(B) can be used, such as source(B) and source(B'), with B and B' independently selected from elements of Group IVB, or as source(B), source(B'), and source(B"), with B, B', and B" independently selected from elements of Group IVB.

Still referring to formula (II), source(A, X) serves as a source of A and X, and, in some instances, source(A, X) can also serve as a source of dopants. Examples of source(A, X) include alkali halides of the form AX. In the case that A is cesium, potassium, or rubidium, for example, source(A, X) can include one or more types of A(I) halides, such as cesium(I) fluoride (i.e., CsF), cesium(I) chloride (i.e., CsCl), cesium(I) bromide (i.e., CsBr), cesium(I) iodide (i.e., CsI), potassium(I) fluoride (i.e., KF), potassium(I) chloride (i.e., KCl), potassium(I) bromide (i.e., KBr), potassium(I) iodide (i.e., KI), rubidium(I) fluoride (i.e., RbF), rubidium(I) chloride (i.e., RbCl), rubidium(I) bromide (i.e., RbBr), and rubidium(I) iodide (i.e., RbI). It is contemplated that different types of source(A, X) can be used, such as source(A, X) and source(A', X'), with A and A' independently selected from elements of Group IA, and X and X' independently selected from elements of Group VIIB, or as source(A, X), source(A', X'), and source(A", X"), with A, A', and A" independently selected from elements of Group IA, and X, X', and X" independently selected from elements of Group VIIB.

Several luminescent materials represented by formulas (I) and (II) have characteristics that are desirable for spectral concentration. In particular, the luminescent materials can exhibit photoluminescence with a high internal quantum efficiency that is greater than about 6 percent, such as at least about 10 percent, at least about 20 percent, at least about 30 percent, at least about 40 percent, or at least about 50 percent, and can be up to about 90 percent or more. Also, the luminescent materials can exhibit photoluminescence with a narrow spectral width that is no greater than about 120 nm at FWHM, such as no greater than about 100 nm or no greater than about 80 nm at FWHM. Thus, for example, the spectral width can be in the range of about 20 nm to about 120 nm at FWHM, such as from about 50 nm to about 120 nm, from about 50 nm to about 100 nm, or from about 50 nm to about 80 nm at FWHM.

In addition, the luminescent materials can have bandgap energies that are tunable to desirable levels by adjusting reactants and processing conditions that are used. For example, a bandgap energy can correlate with A, with the order of increasing bandgap energy corresponding to, for example, cesium, rubidium, potassium, and sodium. As another example, the bandgap energy can correlate with X, with the order of increasing bandgap energy corresponding to, for example, iodine, bromine, chlorine, and fluorine. This order of increasing bandgap energy can translate into an order of decreasing peak emission wavelength. Thus, for example, a luminescent material including iodine can sometimes exhibit a peak emission wavelength in the range of about 900 nm to about 1 μm, while a luminescent material including bromine or chlorine can sometimes exhibit a peak emission wavelength in the range of about 700 nm to about 800 nm. By tuning bandgap energies, the resulting photoluminescence can have a peak emission wavelength located within a desirable range of wavelengths, such as the visible range or the infrared range. In some instances, the peak emission wavelength can be located in the near infrared range, such as from about 900 nm to about 1 μm, from about 910 nm to about 1 μm, from about 910 nm to about 980 nm, or from about 930 nm to about 980 nm.

Moreover, the photoluminescent characteristics described above can be relatively insensitive over a wide range of excitation wavelengths. Indeed, this unusual characteristic can be appreciated with reference to excitation spectra of the luminescent materials, which excitation spectra can be substantially flat over a range of excitation wavelengths encompassing portions of the ultraviolet range, the visible range, and the infrared range. In some instances, the excitation spectra can be substantially flat over a range of excitation wavelengths from about 200 nm to about 1 μm, such as from about 200 nm to about 980 nm or from about 200 nm to about 950 nm. Similarly, absorption spectra of the luminescent materials can be substantially flat over a range of excitation wavelengths encompassing portions of the ultraviolet range, the visible range, and the infrared range. In some instances, the absorption spectra can be substantially flat over a range of excitation wavelengths from about 200 nm to about 1 μm, such as from about 200 nm to about 980 nm or from about 200 nm to about 950 nm.

Two semiconductor materials with desirable characteristics are designated as UD-700 and UD-930. The composition of these materials is represented as $CsSn_bX_{1+2b}$. In the case of UD-700, X is bromine, and, in the case of UD-930, X is iodine. The spectral width of UD-700 and UD-930 is narrow (e.g., about 50 meV or less at FWHM), and the absorption spectrum is substantially flat from the absorption edge into the far ultraviolet. Photoluminescent emission of UD-700 and UD-930 is stimulated by a wide range of wavelengths of solar radiation up to the absorption edge of these materials at about 700 nm for UD-700 and about 950 nm for UD-930.

Desirable characteristics of UD-930 can be further appreciated with reference to FIG. 1, which illustrates a combined representation of a solar spectrum and measured absorption and emission spectra of UD-930 in accordance with an embodiment of the invention. In particular, FIG. 1 illustrates the AM1.5G solar spectrum (referenced as (A)), which is a standard solar spectrum representing incident solar radiation on the surface of the earth. The AM1.5G solar spectrum has a gap in the region of 930 nm due to atmospheric absorption. In view of the AM1.5G solar spectrum and characteristics of PV cells based on silicon, the absorption spectrum (referenced as (B)) and emission spectrum (referenced as (C)) of UD-930 render this material particularly effective for spectral concentration when incorporated within a luminescent layer. In particular, photoluminescence of UD-930 is substantially located in the gap of the AM1.5G solar spectrum, with the peak emission wavelength of about 950 nm falling within the gap. This, in turn, allows the use of reflectors (e.g., above and below the luminescent layer) that are tuned to reflect emitted radiation back towards the luminescent layer, without significant reduction of incident solar radiation that can pass through the reflectors and reach the luminescent layer. Also, the absorption spectrum of UD-930 is substantially flat and extends from the absorption edge at about 950 nm through substantially the full AM1.5G solar spectrum into the ultraviolet. In addition, the peak emission wavelength of about 950 nm (or about 1.3 eV) is matched to the absorption edge of PV cells based on silicon, and the spectral width is about 50 meV at FWHM (or about 37 nm at FWHM). The absorption coefficient of silicon is about $10^2$ $cm^{-1}$ in this range of emission wavelengths, and junctions within the PV cells can be designed to efficiently absorb the emitted radiation and convert the radiation into electron-hole pairs. As a result, UD-930 can broadly absorb a wide range of wavelengths from incident solar radiation, while emitting a narrow range of wavelengths that is matched to silicon to allow a high conversion efficiency of incident solar radiation into electricity. Furthermore, the absorption spectrum and the emission spectrum of UD-930 overlap to a low degree, thereby reducing instances of self-absorption that would otherwise lead to reduced conversion efficiency.

Other luminescent materials that are suitable in spectral concentrators include $Zn_3P_2$, $Cu_2O$, $CuO$, $CuInGaS$, $CuInGaSe$, $Cu_xS$, $CuInSe$, $InS_x$, $ZnS$, $SrS$, $CaS$, $PbS$, $InSe_x$, $CdSe$, and so forth. Additional suitable luminescent materials include $CuInSe_2$ ($E_g$ of about 1.0), $CuInTe_2$ ($E_g$ of about 1.0-1.1), $CuInS_2$ ($E_g$ of about 1.53), $CuAlTe_2$ ($E_g$ of about 1.3-2.2), $CuGaTe_2$ ($E_g$ of about 1.23), $CuGaSe_2$ ($E_g$ of about 1.7), $AgInSe_2$ ($E_g$ of about 1.2), $AgGaSe_2$ ($E_g$ of about 1.8), $AgAlSe_2$ ($E_g$ of about 1.66), $AgInS_2$ ($E_g$ of about 1.8), $AgGaTe_2$ ($E_g$ of about 1.1), $AgAlTe_2$ ($E_g$ of about 0.56), and so forth.

Table I below lists a variety of semiconductor materials that can be used for the applications described herein.

TABLE I

Examples of Spectral Concentrator Materials

| material | $E_g$ (eV, 300K) | type | material | $E_g$ (eV, 300K) | type |
| --- | --- | --- | --- | --- | --- |
| Ge QD | 0.8 to 1.5 | | $BaSnO_3$ | 1.4 | |
| Si QD | 1.2 to 1.5 | | $CrCa_2GeO_4$ | 1.1 | |
| InP | 1.34 | direct | $LaMnO_3$ | 1.3 | |
| $Ga_xIn_{1-x}As_yP_{1-y}$ | 1.2 to 1.4 | | $Ba_{1-x}Sr_xSi_2$ | 1.2 | |
| CdTe | 1.475 | direct | $BaSi_2$ | 1.3 | direct |
| $Ga_2Te_3$ | 1.2 | direct | $ZnGeAs_2$ | 1.12 | direct |
| $In_2Se_3$ | 1.3 | direct | $CdSnP_2$ | 1.17 | direct |
| InSe | 1.2 | indirect | $Cu_3AsS_4$ | 1.24 | |
| $In_2Te_3$ | 1.1 | direct | $CdIn_2Te_4$ | 1.25 | direct |
| InTe | 1.16 | direct | $Na_3Sb$ | 1.1 | |
| $CuGaTe_2$ | 1.2 | | $K_3Sb$ | 1.1 | |
| $CuInS_2$ | 1.5 | | CuO | 1.4 | indirect |
| $Cu_3In_5Se_9$ | 1.1 | | $Cu_2O$ | 1.4 | forbidden, direct |
| $CuInS_{2-x}Se_x$ | 1.1 to 1.4 | direct | $Cu_2S$ | 1.3 | direct |
| $Ag_3In_5Se_9$ | 1.22 | | $Cu_2Se$ | 1.2 | direct |
| $AgGaTe_2$ | 1.3 | direct | $Cd_4Sb_3$ | 1.4 | |
| $AgInSe_2$ | 1.2 | direct | TlS | 1.36 | direct |
| $CuTlS_2$ | 1.4 | | $BiS_3$ | 1.3 | |
| $Cr_2S_3$ | 1.1 | | $BiI_3$ | 1.35 | |
| $FeP_2$ | 0.4 | | $NiP_2$ | 0.7 | |
| $FeSi_2$ | 0.8 | | SnS | 1.1 | |
| $Mg_2Si$ | 0.8 | | SnSe | 0.9 | |
| $MoS_2$ inte. | <1.4 | | $Ti_{1+x}S_2$ | 0.7 | |
| $MoSe_2$ inte. | <1.2 | | $TiS_{3-x}$ | 0.9 | |
| $WS_2$ inte. | 1.1 | | $Zn_3N_2$ | 1.2 | |
| $Sr_2CuO_2Cl$ | 1.3 | direct | $Ag_8GeS_6$ | 1.39 | |
| $ZnGeP_2$ | 1.3 | direct | $Ag_8SnS_6$ | 1.28 | |
| $Zn_3P_2$ | 1.35 | indirect | $CdInSe_2$ | 1.4 | |
| $Zn_3P_2$ | 1.4 | direct | $HgTlS_2$ | 1.25 | |
| β $ZnP_2$ | 1.3 | direct | BiSeI | 1.3 | |
| $KTaO_3$ | 1.5 | | $MgGa_2S_4$ | 1.2 | |

Absorption and emission characteristics are typically several orders of magnitude lower for semiconductor materials having indirect optical transitions or forbidden optical transitions compared to those materials having direct optical transitions. However, by modification of a radiation matrix, resonant cavity effects can enhance absorption and emission characteristics and allow the use of semiconductor materials having indirect or forbidden optical transitions. Referring to Table I, CuO is an indirect bandgap semiconductor material having a bandgap energy of about 1.4 eV, and $Cu_2O$ has a direct but spin forbidden bandgap energy of about 1.4 eV. By incorporating within a resonant cavity structure, either, or both, CuO and $Cu_2O$ can be used for spectral concentration. Still referring to Table I, $Zn_3P_2$ has an indirect optical transition of about 50 meV below a direct optical transition of about 1.4 eV. Cavity effects can allow coupling of the indirect optical transition to the higher energy direct optical transition, thereby providing enhanced absorption and emission for use as spectral concentrators.

In addition to the characteristics noted above, the semiconductor materials listed in Table I typically have an index of refraction greater than about 3. For example, InP has an index of refraction of about 3.2. Because of internal reflection, less than about 18% of light within a luminescent stack can exit to air. In some instances, light normal to a surface of the luminescent stack can have a Fresnel reflection loss of about 25% to air. Anti-reflection coatings can be used to enhance optical coupling of the light from the luminescent stack to a PV cell.

To reduce self-absorption of emitted light within a luminescent stack, luminescence can occur via exciton emission. An exciton corresponds to an electron-hole pair, which can be formed as a result of light absorption. A bound or free exciton can have a Stokes shift equal to an exciton binding energy. Most semiconductor materials have exciton binding energies of less than about 20 meV. Room temperature is about 25 meV, so excitons are typically not present at room temperature for these materials. Some semiconductor materials, such as CdTe and HgTe, have excitons with high binding energies and are present at room temperature. However, some of these semiconductor materials may be toxic or relatively expensive. Other semiconductor materials have intrinsic excitons at room temperature, such as bismuth triiodide or $BiI_3$, and can be desirable for the applications described herein.

Certain layered semiconductor materials, such as tin and lead halides, can have bandgap and exciton energies tuned by separation of inorganic layers with organic components. Examples include organic-inorganic quantum well materials, conducting layered organic-inorganic halides containing 110-oriented perovskite sheets, hybrid tin iodide perovskite semiconductor materials, and lead halide-based perovskite-type crystals. Certain aspects of these semiconductor materials are described in Ema et al., "Huge Exchange Energy and Fine Structure of Excitons in an Organic-Inorganic Quantum Well," Physical Review B, Vol. 73, pp. 241310-1 to 241310-4 (2006); Mitzi et al., "Conducting Layered Organic-inorganic Halides Containing 110-Oriented Perovskite Sheets," Science, Vol. 267, pp. 1473-1476 (1995); Kagan et al., "Organic-Inorganic Hybrid Materials as Semiconducting Channels in Thin-Film Field-Effect Transistors," Science, Vol. 286, pp. 945-947 (1999); Mitzi, "Solution-processed Inorganic Semiconductors," J. Mater. Chem., Vol. 14, pp. 2355-2365 (2004); Symonds et al., "Emission of Hybrid Organic-inorganic Exciton Plasmon Mixed States," Applied Physics Letters, Vol. 90, 091107 (2007); Zoubi et al., "Polarization Mixing in Hybrid Organic-Inorganic Microcavities," Organic Electronics, Vol. 8, pp. 127-135 (2007); Knutson et al., "Tuning the Bandgap in Hybrid Tin Iodide Perovskite Semiconductors Using Structural Templating," Inorg. Chem., Vol. 44, pp. 4699-4705 (2005); and Tanaka et al., "Comparative Study on the Excitons in Lead-halide-based Perovskite-type crystals $CH_3NH_3PbBr_3$ $CH_3NH_3PbI_3$," Solid State Communications, Vol. 127, pp. 619-623 (2003), the disclosures of which are incorporated herein by reference in their entireties.

Also, other layered materials, such as tin sulfide, tin selenide, titanium sulfide, and others listed in Table I, can be tuned by intercalating other materials between the layered materials. A suitable deposition technique can be used to make layered materials with tuned bandgap energies and tuned exciton binding energies. Tuning an exciton to higher energy can reduce self-absorption and enhance the probability of lasing. Such material-process combination can be used to develop a low self-absorption luminescent material by tuned exciton luminescent emission. This can be further combined with a resonant cavity structure, in either a weak or strong coupling regime, to produce a low loss, high quantum efficiency, down-conversion structure. Thermal quenching, namely the reduction of luminescence intensity with an increase in temperature, can be reduced or eliminated by generating an exciton with a binding energy greater than the Boltzman temperature, which is about 25 meV at room temperature. For solar applications, a binding energy in the range of about 35 meV to about 50 meV can be desirable. A larger binding energy can lead to a Stokes shift in the photoluminescence from the absorption edge that results in an absorption gap, thereby leading to lower solar energy conversion efficiencies.

Another way to reduce self-absorption is via the use of orientated birefringence. In particular, one way to reduce self-absorption in a specific direction within a single crystal or film is to orient a birefringent material. Birefringence refers to a different refractive index along two or more different directions of a material. A birefringent material, such as a semiconductor material, has two or more different bandgap energies along different crystal axis. If a crystal anisotropy has a bandgap in the visible region of an optical spectrum, the material can be referred as being dichoric rather than birefringent. Various birefringent semiconductor materials can be used as spectral concentrators, such as $CuInSe_{2-x}S_x$, $Zn_3N_2$, and perovskites such as $CsSn_{1+x}I_{3+2x}$. Since there are two or more absorption edges or bandgap energies for a birefringent material, a resulting film can be deposited in an oriented state with the higher bandgap energy (i.e., shorter wavelength absorption edge) along a direction facing towards PV cells. In this case, emitted light in the direction facing towards the PV cells can have a lower absorbance because the emission wavelength is longer than the higher energy bandgap. The use of resonant cavity effects and Bragg reflectors can suppress emission in other, more highly self-absorbed directions.

Thermal quenching and self-absorption can also be reduced by modifying material characteristics. For semiconductor materials, an absorption edge can become tilted with increasing temperature and certain types of doping. This absorption edge tilt can sometimes lead to increased self-absorption, and can be described by the Elliott equation. Proper doping and interface or surface modification can be used to control this absorption edge tilt to reduce instances of thermal quenching and self-absorption. In the case of nanoparticles formed of a semiconductor material, coatings formed on the nanoparticles can alter emission characteristics of the semiconductor material by the "Bragg Onion" technique.

The solar spectrum on the surface of the earth ranges from the ultraviolet into the infrared. Photons absorbed from the ultraviolet to about 1.3 eV are about 49.7 percent of the total number of photons and about 46.04 percent of the total energy. Of the absorbed photons at 100 percent internal quantum efficiency, a luminescent material with emission at about 1.3 eV can yield a solar energy conversion efficiency of about 46 percent (for one photon to one photon mechanism). Multiple photon generation can yield higher solar energy conversion efficiencies. Silicon nanoparticles, such as silicon quantum dots, that emit multiple photons can be used as spectral concentrators described herein to provide higher conversion efficiencies. Certain aspects of silicon nanoparticles are described in Beard et al., "Multiple Exciton Generation in Colloidal Silicon Nanocrystals," Nano Letters, Vol. 7, No. 8, pp. 2506-12 (2007), the disclosure of which is incorporated herein by reference in its entirety. Also, a quantum cutting material can exhibit down-conversion by absorbing one shorter wavelength photon and emitting two or more longer wavelength photons. A quantum cutting material can be included in a luminescent stack described herein, such as in an upper portion facing incident solar radiation.

Since about one half of incident solar radiation is at lower energy, or longer wavelength, than 1.3 eV (or 950 nm), conversion efficiency can be increased by up-conversion. Up-conversion can involve a process where two photons are absorbed and one photon is emitted at a higher energy. Rare earth atoms can be relatively efficient at undergoing up-conversion, and other processes, such as Second Harmonic Generation ("SHG") at relatively high intensities, can be used to enhance solar energy conversion efficiencies. The use of resonant cavity effects in a spectral concentrator can enhance up-conversion and non-linear processes such as SHG. Certain aspects of up-conversion are described in Sark et al., "Enhancing Solar Cell Efficiency by Using Spectral Converters," Solar Energy Materials & Solar Cells, Vol. 87, pp. 395-409 (2005); and Shalav et al., "Luminescent Layers for Enhanced Silicon Solar Cell Performance: Up-conversion," Solar Energy Materials & Solar Cells, Vol. 91, pp. 829-842 (2007), the disclosures of which are incorporated herein by reference in their entireties.

Solar Modules

Figure 2:
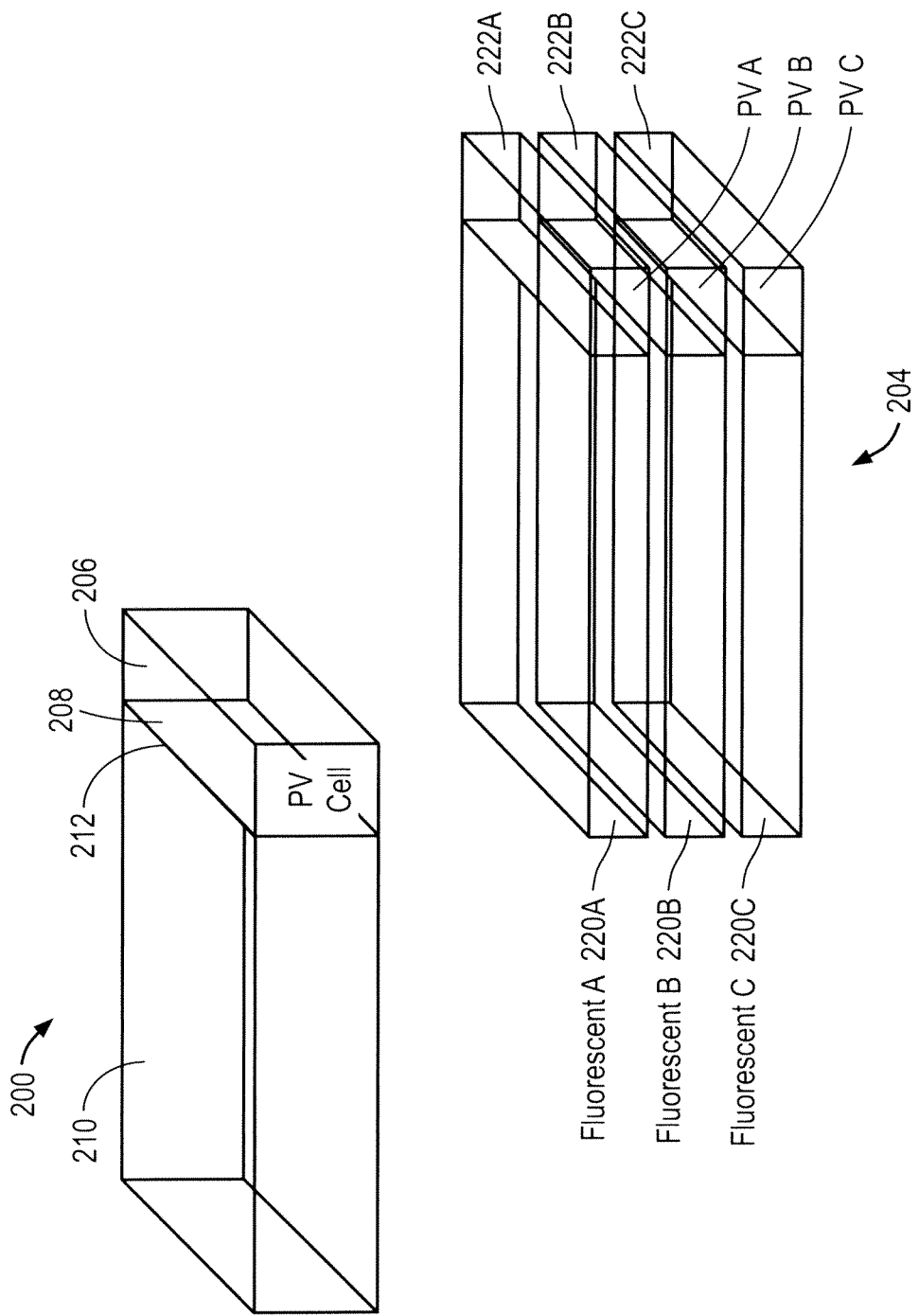
FIG. 2 illustrates solar modules implemented in accordance with certain embodiments of the invention.

FIG. 2 illustrates solar modules 200 and 204 implemented in accordance with certain embodiments of the invention.

As illustrated in FIG. 2, the solar module 200 includes a PV cell 206, which is a p-n junction device formed from crystalline silicon. However, the PV cell 206 can also be formed from another suitable photoactive material. As illustrated in FIG. 2, the PV cell 206 is configured to accept and absorb radiation incident upon a side surface 208 of the PV cell 206, although other surfaces of the PV cell 206 can also be involved.

In the illustrated embodiment, the solar module 200 also includes a spectral concentrator 210, which is formed as a slab having a side surface 212 that is adjacent to the side surface 208 of the PV cell 206. The spectral concentrator 210 performs spectral concentration by converting a relatively wide range of energies of solar radiation into a narrow band of energies close to the bandgap energy of silicon, or another photoactive material forming the PV cell 206. In turn, the narrow band radiation emitted from the spectral concentrator 210 can be efficiently absorbed within a depletion region of the PV cell 206. By matching the energy of the emitted radiation with the bandgap energy of the PV cell 206, much higher solar energy conversion efficiencies can be achieved, including efficiencies of 90 percent or more.

During operation of the solar module 200, incident solar radiation strikes the spectral concentrator 210, which absorbs this solar radiation and emits radiation in a substantially monochromatic energy band. In particular, the spectral concentrator 210 is configured to perform down-conversion with a bandgap energy $E_g$ close to a bandgap energy of the PV cell 206. Solar radiation with energies at or higher than the bandgap energy $E_g$ is absorbed and converted into emitted radiation with lower energies that match the bandgap energy of the PV cell 206. In this manner, thermalization can mostly occur within the spectral concentrator 210, rather than within the PV cell 206. It is also contemplated that the spectral concentrator 210 can be configured to perform up-conversion, such that solar radiation with lower energies is absorbed and converted into emitted radiation with higher energies that match the bandgap energy of the PV cell 206. Emitted radiation from the spectral concentrator 210 is guided within the spectral concentrator 210 and is directed towards the side surface 208 of the PV cell 206, which absorbs and converts this emitted radiation into electricity. In the illustrated embodiment, the PV cell 206 is optimized to operate with respect to the substantially monochromatic, emitted radiation, but can also operate efficiently with respect to incident solar radiation.

Still referring to FIG. 2, the solar module 204 is a multi junction device, including multiple layers of spectral concentrators 220A, 220B, and 220C that are optically coupled to respective PV cells 222A, 222B, and 222C having different bandgap energies. For example, the PV cells 222A, 222B, and 222C can be formed from Group III materials, Group IV materials, Group V materials, or combinations thereof, with bandgap energies in the range of about 2.5 eV to about 1.3 eV or in the range of about 2.5 eV to about 0.7 eV. For example, silicon has a bandgap energy of about 1.1 eV, and germanium has a bandgap energy of about 0.7 eV. Certain aspects of the solar module 204 can be implemented in a similar manner as described above for the solar module 200, and, therefore, are not further described herein.

During operation of the solar module 204, incident solar radiation strikes the spectral concentrator 220A, which is configured to perform down-conversion with a bandgap energy $E_{gA}$ close to a bandgap energy of the PV cell 222A. Solar radiation with energies at or higher than the bandgap energy $E_{gA}$ is absorbed and converted into substantially monochromatic, emitted radiation that is guided towards the PV cell 222A, which absorbs and converts this emitted radiation into electricity. Solar radiation with energies lower than the bandgap energy $E_{gA}$ passes through the spectral concentrator 220A and strikes the spectral concentrator 220B, which is configured to perform down-conversion with a bandgap energy $E_{gB}$ close to a bandgap energy of the PV cell 222B. Solar radiation with energies at or higher than the bandgap energy $E_{gB}$ (and lower than the bandgap energy $E_{gA}$) is absorbed and converted into substantially monochromatic, emitted radiation that is guided towards the PV cell 222B, which absorbs and converts this emitted radiation into electricity. Solar radiation with energies lower than the bandgap energy $E_{gB}$ passes through the spectral concentrator 220B and strikes the spectral concentrator 220C, which is configured to perform down-conversion with a bandgap energy $E_{gC}$ close to a bandgap energy of the PV cell 222C. Solar radiation with energies at or higher than the bandgap energy $E_{gC}$ (and lower than the bandgap energy $E_{gB}$) is absorbed and converted into substantially monochromatic, emitted radiation that is guided towards the PV cell 222C, which absorbs and converts this emitted radiation into electricity. In the illustrated embodiment, bandgap energies $E_{gA}$, $E_{gB}$, and $E_{gC}$ are related as follows: $E_{gA} > E_{gB} > E_{gC}$.

By operating in such manner, the solar module 204 provides enhanced utilization of a solar spectrum, by allowing different energy bands within the solar spectrum to be collected and converted into electricity. While three layers are illustrated in FIG. 2, the solar module 204 can include more or less layers depending upon the particular implementation. In some instances, solar energy conversion efficiency can be increased from a value of about 31 percent when one PV cell is used to a value of about 50 percent when three PV cells are used and towards a value of about 85 percent when a virtually unlimited number of PV cells are used.

Figure 3:
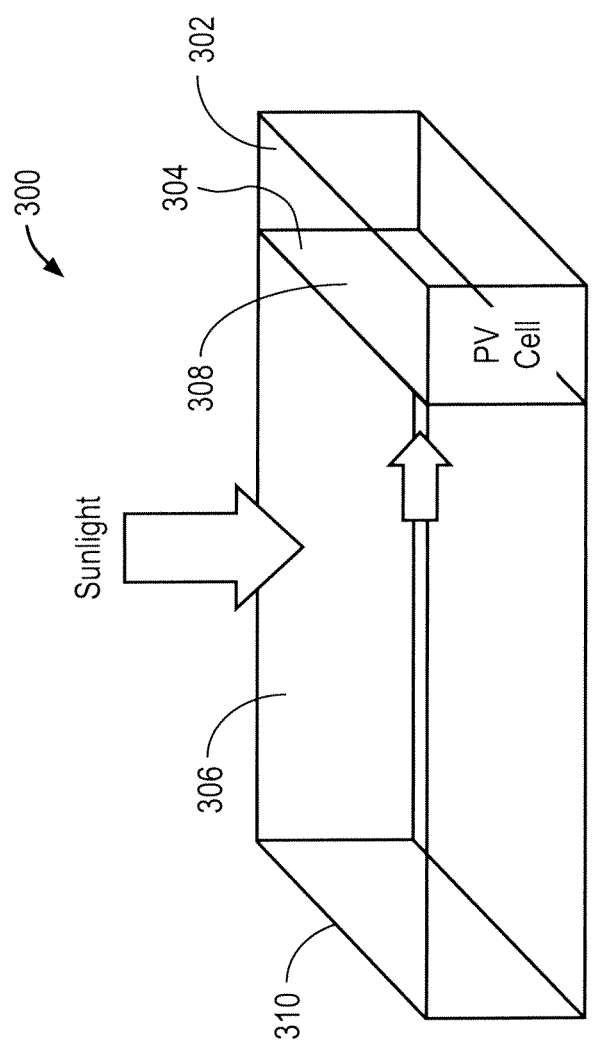
FIG. 3 illustrates a solar module implemented in accordance with another embodiment of the invention.

Additional aspects and benefits of spectral concentration can be appreciated with reference to FIG. 3, which illustrates a solar module 300 implemented in accordance with another embodiment of the invention. The solar module 300 includes a PV cell 302, which is a p-n junction device formed from a thin slice or strip of crystalline silicon. The use of thin slices of silicon allows a reduction in silicon consumption, which, in turn, allows a reduction in manufacturing costs. Micromachining operations can be performed on a silicon wafer to form numerous silicon slices, and each of the silicon slices can be further processed to form PV cells, such as the PV cell 302. The PV cell 302 can have dimensions of about 300 µM by about 300 µm by a few centimeters in length, or dimensions of about 250 µm by about 250 µm by about 3 inches in length. As illustrated in FIG. 3, the PV cell 302 is configured to accept and absorb radiation incident upon a side surface 304 of the PV cell 302, although other surfaces of the PV cell 302 can also be involved.

In the illustrated embodiment, the solar module 300 also includes a spectral concentrator 306, which is formed as a slab having a side surface 308 that is adjacent to the side surface 304 of the PV cell 302. The spectral concentrator 306 includes a set of luminescent materials that convert a relatively wide range of energies of solar radiation into a relatively narrow, substantially monochromatic energy band that is matched to an absorption spectrum of the PV cell 302. During operation of the solar module 300, incident solar radiation strikes a top surface 310 of the spectral concentrator 306, and a certain fraction of this incident solar radiation penetrates below the top surface 310 and is absorbed and converted into substantially monochromatic, emitted radiation. This emitted radiation is guided laterally within the spectral concentrator 306, and a certain fraction of this emitted radiation reaches the side surface 304 of the PV cell 302, which absorbs and converts this emitted radiation into electricity.

In effect, the spectral concentrator 306 performs a set of operations, including: (1) collecting incident solar radiation; (2) converting the incident solar radiation into substantially monochromatic, emitted radiation near a bandgap energy of the PV cell 302; and (3) conveying the emitted radiation to the PV cell 302, where the emitted radiation can be converted to useful electrical energy. The spectral concentrator 306 can include distinct structures that are optimized or otherwise tailored towards respective ones of the collection, conversion, and conveyance operations. Alternatively, certain of these operations can be implemented within a common structure. These operations that are performed by the spectral concentrator 306 are further described below.

Collection refers to capturing or intercepting incident solar radiation in preparation for conversion to emitted radiation. Collection efficiency of the spectral concentrator 306 can depend upon the amount and distribution of a luminescent material within the spectral concentrator 306. In some instances, the luminescent material can be viewed as a set of luminescent centers that can intercept incident solar radiation, and a greater number of luminescent centers typically increases the collection efficiency. Depending upon the distribution of the luminescent centers, collection of incident solar radiation can occur in a distributed fashion throughout the spectral concentrator 306, or can occur within one or more regions of the spectral concentrator 306. The collection efficiency can also depend upon other aspects of the spectral concentrator 306, including the ability of incident solar radiation to reach the luminescent material. In particular, the collection efficiency is typically improved by suitable optical coupling of incident solar radiation to the luminescent material, such as via an anti-reflection coating to reduce reflection of incident solar radiation.

Conversion refers to emitting radiation in response to incident solar radiation, and the efficiency of such conversion refers to the probability that an absorbed solar photon is converted into an emitted photon. Conversion efficiency of the spectral concentrator 306 can depend upon photoluminescent characteristics of a luminescent material, including its internal quantum efficiency, but can also depend upon interaction of luminescent centers with their local optical environment, including via resonant cavity effects. Depending upon the distribution of the luminescent centers, conversion of incident solar radiation can occur in a distributed fashion throughout the spectral concentrator 306, or can occur within one or more regions of the spectral concentrator 306. Also, depending upon the particular luminescent material used, the conversion efficiency can depend upon wavelengths of incident solar radiation that are absorbed by the luminescent material.

Conveyance refers to guiding or propagation of emitted radiation towards the PV cell 302, and the efficiency of such conveyance refers to the probability that an emitted photon reaches the PV cell 302. Conveyance efficiency of the spectral concentrator 306 can depend upon photoluminescent characteristics of a luminescent material, including a degree of overlap between emission and absorption spectra, but can also depend upon interaction of luminescent centers with their local optical environment, including via resonant cavity effects.

By performing these operations, the spectral concentrator 306 provides a number of benefits. In particular, by performing the collection operation in place of the PV cell 302, the spectral concentrator 306 allows a significant reduction in silicon consumption, which, in turn, allows a significant reduction in manufacturing costs. In some instances, the amount of silicon consumption can be reduced by a factor of about 10 to about 1000. Also, the spectral concentrator 306 enhances solar energy conversion efficiency based on at least two effects: (1) concentration effect; and (2) monochromatic effect.

In terms of the concentration effect, the spectral concentrator 306 performs spectral concentration by converting a relatively wide range of energies of incident solar radiation into a narrow band of energies close to the bandgap energy of the PV cell 302. Incident solar radiation is collected via the top surface 310 of the spectral concentrator 306, and emitted radiation is guided towards the side surface 304 of the PV cell 302. A solar radiation collection area, as represented by, for example, an area of the top surface 310 of the spectral concentrator 306, can be significantly greater than an area of the PV cell 302, as represented by, for example, an area of the side surface 304 of the PV cell 302. A resulting concentration factor onto the PV cell 302 can be in the range of about 10 to about 100 and up to about 1000 or more. In turn, the concentration factor can increase the open circuit voltage or $V_{oc}$ of the solar module 300, and can yield an increase in solar energy conversion efficiency of about 2 percent (absolute), or 10 percent (relative), for each concentration factor of 10 in emitted radiation reaching the PV cell 302. A typical solar radiation energy flux is about 100 mW cm$^{-2}$, and, in some instances, a concentration factor of up to 10$^6$ (or more) can be achieved by optimizing the spectral concentrator 306 with respect to the collection, conversion, and conveyance operations.

In teems of the monochromatic effect, the narrow band radiation emitted from the spectral concentrator 306 can be efficiently absorbed by the PV cell 302, which can be optimized in terms of its junction design to operate on this narrow band, emitted radiation. In addition, by matching the energy of the emitted radiation with the bandgap energy of the PV cell 302, thermalization can mostly occur within the spectral concentrator 306, rather than within the PV cell 302.

Figure 4:
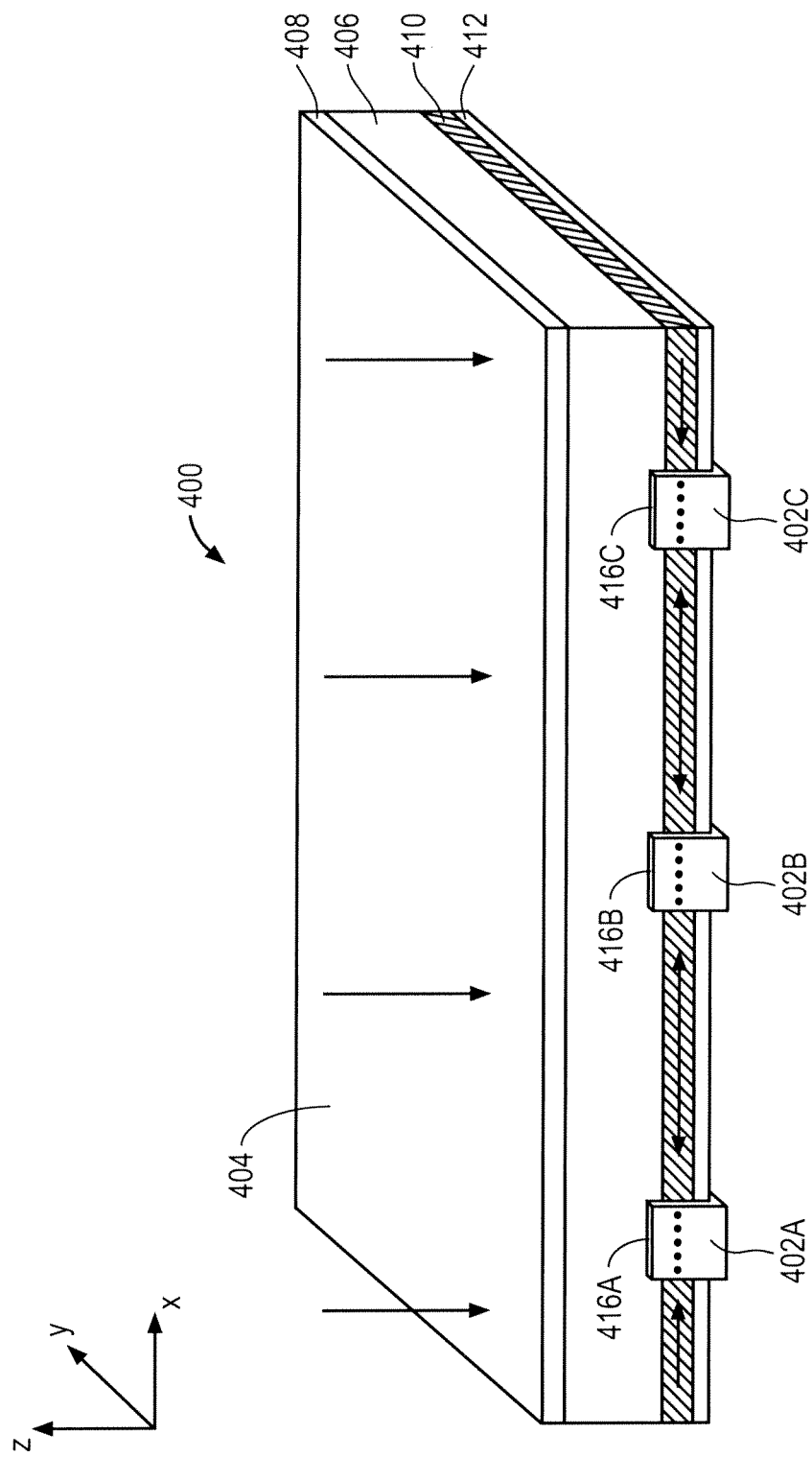
FIG. 4 illustrates a solar module implemented in accordance with another embodiment of the invention.

Attention next turns to FIG. 4, which illustrates a solar module 400 implemented in accordance with another embodiment of the invention. The solar module 400 includes multiple rows 402A, 402B, and 402C of PV cells, which are spaced with respect to one another by about 2 cm to about 10 cm along the x direction. While three rows 402A, 402B, and 402C are illustrated in FIG. 4, more or less rows can be included depending upon the particular implementation. In the illustrated embodiment, each of the rows 402A, 402B, and 402C includes multiple PV cells that are connected in series, although a parallel connection is also contemplated. Connection of PV cells in series can serve to increase output voltage, while connection of PV cells in parallel can serve to increase output current. PV cells within a particular row, such as the row 402A, can be p-n junction devices, and the p-n orientation of the PV cells can alternate along the y direction for that row. As illustrated in FIG. 4, each of the rows 402A, 402B, and 402C is bifacial and, thus, is able to accept and absorb radiation incident upon two side surfaces.

In the illustrated embodiment, the solar module 400 also includes a spectral concentrator 404, which includes multiple structures that allow the spectral concentrator 404 to perform collection, conversion, and conveyance operations. In particular, the spectral concentrator 404 includes a substrate layer 406, which is formed from a glass, a polymer, or another suitable material that is optically transparent or translucent. An anti-reflection layer 408 is formed adjacent to a top surface of the substrate layer 406 to reduce reflection of incident solar radiation. As illustrated in FIG. 4, the spectral concentrator 404 also includes a luminescent stack 410, which includes a set of luminescent materials that convert incident solar radiation into a relatively narrow, substantially monochromatic energy band that is matched to an absorption spectrum of the rows 402A, 402B, and 402C of PV cells. The luminescent stack 410 is sandwiched by the substrate layer 406 and another substrate layer 412, which are adjacent to a top surface and a bottom surface of the luminescent stack 410, respectively. The substrate layer 412 serves to protect the luminescent stack 410 from environmental conditions, and is formed from a glass, a polymer, or another suitable material. While not illustrated in FIG. 4, side edges and surfaces of the spectral concentrator 404, which are not involved in conveyance of radiation, can have a Lambertian reflector formed thereon, such as white paint or another suitable reflective material.

Still referring to FIG. 4, the spectral concentrator 404 includes multiple grooves 416A, 416B, and 416C to accommodate respective ones of the rows 402A, 402B, and 402C of PV cells. During manufacturing of the spectral concentrator 404, various layers can be formed, and certain portions of these layers can be removed to form the grooves 416A, 416B, and 416C. Alternatively, a selective deposition technique can be implemented to form the grooves 416A, 416B, and 416C.

During operation of the solar module 400, incident solar radiation strikes a top surface of the spectral concentrator 404, and a certain fraction of this incident solar radiation passes through the substrate layer 406 and reaches the luminescent stack 410. In turn, the luminescent stack 410 absorbs and converts this solar radiation into substantially monochromatic, emitted radiation. This emitted radiation is then guided within the luminescent stack 410, and a certain fraction of this emitted radiation reaches the rows 402A, 402B, and 402C of PV cells, which absorb and convert this emitted radiation into electricity. As can be appreciated with reference to FIG. 4, guiding of emitted radiation is such that each of the rows 402A, 402B, and 402C of PV cells is illuminated from two sides, thereby enhancing solar energy conversion efficiency. The orientation of PV cells within each row is such that depletion regions of the PV cells are substantially perpendicular with respect to incident solar radiation, but are substantially aligned with respect to emitted radiation guided along the luminescent stack 410. This orientation of the PV cells can provide a number of benefits, including enhancing uniformity of optical excitation across the depletion regions and enhancing solar energy conversion efficiencies.

Figure 5:
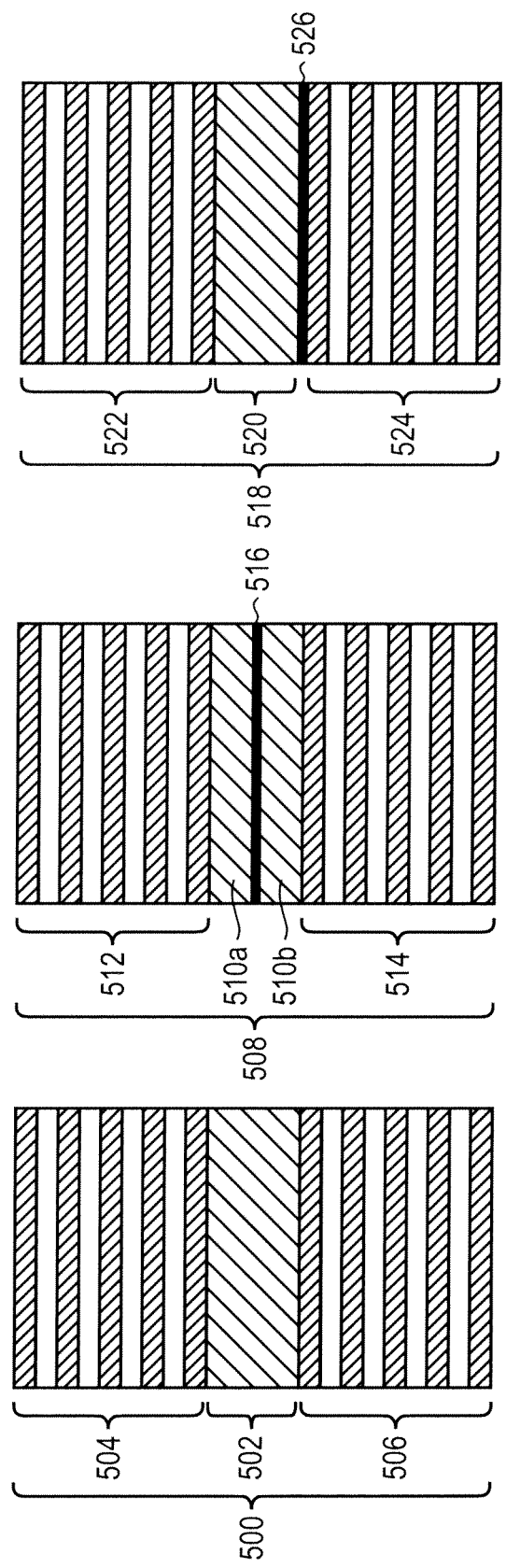
FIG. 5 illustrates luminescent stacks implemented in accordance with certain embodiments of the invention.

FIG. 5 illustrates luminescent stacks 500, 508, and 518 implemented in accordance with certain embodiments of the invention.

As illustrated in FIG. 5, the luminescent stack 500 includes a luminescent layer 502, which includes a set of luminescent materials that convert a relatively wide range of energies of solar radiation into a relatively narrow, substantially monochromatic energy band. By selecting a luminescent material having a high absorption coefficient for solar radiation, a thickness of the luminescent layer 502 can be reduced, such as in the range of about 0.1 µm to about 2 µm, in the range of about 0.2 µM to about 1 µm, or in the range of about 0.2 µn to about 0.5 µm.

Referring to FIG. 5, the luminescent layer 502 is sandwiched by a top reflector 504 and a bottom reflector 506, which are adjacent to a top surface and a bottom surface of the luminescent layer 502, respectively. This pair of reflectors 504 and 506 serve to reduce loss of emitted radiation out of the luminescent stack 500 as the emitted radiation is guided towards a PV cell. The top reflector 504 is omni-reflective over emission wavelengths, while allowing relevant wavelengths of incident solar radiation to pass through and strike the luminescent layer 502. The bottom reflector 506 is omni-reflective over substantially all wavelengths and, thus, allow for two-pass solar irradiation. In particular, any remaining fraction of the solar radiation, which passes through the luminescent layer 502, strikes the bottom reflector 506, which reflects the solar radiation. Reflected radiation is directed upwards and strikes the luminescent layer 502, which can absorb and convert this reflected radiation into emitted radiation. It is also contemplated that the bottom reflector 506 can be omni-reflective over emission wavelengths, rather than having broadband reflectivity.

In the illustrated embodiment, each of the top reflector 504 and the bottom reflector 506 is implemented as a dielectric stack, including multiple dielectric layers and with the number of dielectric layers in the range of 2 to 1,000, such as in the range of 2 to 100 or in the range of 30 to 80. Each dielectric layer can have a thickness in the range of about 0.001 µm to about 0.2 µm, such as in the range of about 0.01 µm to about 0.15 p.m. For certain implementations, a dielectric stack can include alternating layers formed from different dielectric materials. Examples of dielectric materials that can be used to form the top reflector 504 and the bottom reflector 506 include silica (e.g., $SiO_2$ or $\alpha\text{-}SiO_2$), alumina (e.g., $Al_2O_3$), $TiO_2$, $SiO_xN_{2-x}$, and other suitable thin-film dielectric materials. The top reflector 504 and the bottom reflector 506 can have tolerances (in terms of a Q value) that are up to $10^8$ or more, such as in the range of about 5 to about 100 or in the range of about 5 to about 10. For other implementations, at least one of the top reflector 504 and the bottom reflector 506 can be implemented as a photonic crystal, or a set of photonic crystals can be included along with the top reflector 504 and the bottom reflector 506, such as between the top reflector 504 and the luminescent layer 502 and between the bottom reflector 506 and the luminescent layer 502. A photonic crystal is typically implemented as a mesoscopic array of two or more materials with differing indices of refraction that are arranged in a substantially periodic manner. For light in the visible and near infrared ranges, spacing within the array can be in the range of a few hundred nanometers to a micron or so. The array can extend in one dimension, two dimensions, or three dimensions. Examples of photonic crystals include those based on a Bragg reflector, a planar cavity formed by two opposed dielectric interference reflectors, and an omni-directional mirror. An example of a three dimensional photonic crystal is one based on a three dimensional Bragg grating. A photonic crystal can serve to reflect emitted radiation and preferentially re-distribute or re-direct the emitted radiation from an original isotropic distribution to an anisotropic distribution substantially along an in-plane guiding direction. Another nano-structured or micro-structured layer can be similarly implemented in place of, or in conjunction with, a photonic crystal.

Depending on the number of dielectric layers forming the top reflector 504 and the bottom reflector 506, a total thickness of the luminescent stack 500 can be in the range of about 0.4 µm to about 4 µm, such as in the range of about 1 µm to about 2 µm or in the range of about 1 µM to about 1.5 µm. While a single luminescent layer 502 is illustrated in FIG. 5, it is contemplated that multiple luminescent layers can be included in other implementations. These multiple luminescent layers can be formed on top of one another or can be interspersed among multiple dielectric layers. Also, while not illustrated in FIG. 5, a buffer layer can be included between the top reflector 504 and the luminescent layer 502 to provide index matching. The buffer layer can be formed from a suitable low index material and can have a thickness in the range of about 1 nm to about 100 nm, such as in the range of about 10 nm to about 100 µn. A similar buffer layer can also be included between the bottom reflector 506 and the luminescent layer 502.

Still referring to FIG. 5, the luminescent stack 508 includes a top reflector 512 and a bottom reflector 514, which are implemented as dielectric stacks including multiple dielectric layers. Certain aspects of the luminescent stack 508 can be implemented in a similar manner as described above for the luminescent stack 500, and, therefore, are not further described herein.

In the illustrated embodiment, the pair of reflectors 512 and 514 sandwich a pair of luminescent layers, namely a top luminescent layer 510a and a bottom luminescent layer 510b, such that the top reflector 512 is adjacent to a top surface of the top luminescent layer 510a, and the bottom reflector 514 is adjacent to a bottom surface of the bottom luminescent layer 510b. While the pair of luminescent layers 510a and 510b are illustrated in FIG. 5, it is contemplated that additional luminescent layers can be included in other implementations. Each of the luminescent layers 510a and 510b includes a set of luminescent materials that convert a relatively wide range of energies of solar radiation into a relatively narrow, substantially monochromatic energy band. The luminescent layers 510a and 510b can be formed from the same set of luminescent materials or from different sets of luminescent materials. For example, the luminescent layers 510a and 510b can be formed from respective luminescent materials having different bandgap energies and having different peak emission wavelengths, such that the luminescent stack 508 can be included within a multi-junction device.

As another example, the luminescent layer 510a can be formed from a luminescent material that performs down-conversion, while the luminescent layer 510b can be formed from a luminescent material that performs up-conversion. During operation of the luminescent stack 508, incident solar radiation strikes the luminescent layer 510a, which absorbs a certain fraction of this solar radiation and emits radiation in a substantially monochromatic energy band. In particular, the luminescent layer 510a is configured to perform down-conversion with a bandgap energy $E_{gA}$ close to a bandgap energy of a PV cell. Solar radiation with energies at or higher than the bandgap energy $E_{gA}$ is absorbed and converted into emitted radiation with lower energies that match the bandgap energy of the PV cell. Solar radiation with energies lower than the bandgap energy $E_{gA}$ is not absorbed by the luminescent layer 510a and passes through the luminescent layer 510a. The lower energy radiation strikes the luminescent layer 510b, which absorbs this solar radiation and emits radiation in a substantially monochromatic energy band. In particular, the luminescent layer 510b is configured to perform up-conversion with a bandgap energy $E_{gB}$ also close to the bandgap energy of the PV cell. In other words, the bandgap energy $E_{gB}$ is substantially the same as the bandgap energy $E_{gA}$, and solar radiation with lower energies is absorbed and converted by the luminescent layer 510b into emitted radiation with higher energies that match the bandgap energy of the PV cell.

Referring to FIG. 5, a bonding layer 516 is included between the luminescent layers 510a and 510b, and serves to connect the luminescent layers 510a and 510b via adhesion, hydrogen bonding, or inter-diffusion. The bonding layer 516 can have a thickness in the range of about 1 nm to about 100 nm, such as in the range of about 10 nm to about 100 nm. Examples of materials that can be used to form the bonding layer 516 include a glass, such as a spin-on glass or a sealing glass, a polymer, such as a perfluoropolymer or an epoxy-based polymer, or another suitable adhesive or bonding material that is optically transparent or translucent. For certain implementations, the bonding layer 516 can provide index matching to enhance optical coupling between the luminescent layers 510a and 510b and to enhance an efficiency at which emitted radiation is guided towards a PV cell. The bonding layer 516 can be formed from a suitable low index material, such that the luminescent stack 508 serves as an Antiresonant Reflecting Optical Waveguide ("ARROW"). An ARROW is typically based on the Fabry-Perot effect for guiding, rather than total internal reflection, and can provide enhanced photoluminescence and low loss guiding towards the PV cell. The ARROW can allow certain optical modes to be substantially centered on a low index region corresponding to the bonding layer 516. In such manner, substantial propagation of light can occur in the bonding layer 516, and self-absorption can be reduced.

Certain aspects of ARROW structures are described in Huang et al., "The Modal Characteristics of ARROW structures," Journal of Lightwave Technology, Vol. 10, No. 8, pp. 1015-1022 (1992); Litchinitser et al., "Application of an ARROW Model for Designing Tunable Photonic Devices," Optics Express, Vol. 12, No. 8, pp. 1540-1550 (2004); and Liu et al., "Characteristic Equations for Different ARROW Structures," Optical and Quantum Electronics, Vol. 31, pp. 1267-1276 (1999); the disclosures of which are incorporated herein by reference in their entireties. Alternatively, or in conjunction, a set of passive waveguide layers with a higher or lower index of refraction (relative to the luminescent layers 510a and 510b) can be included to provide the main waveguide function. In such manner, substantial propagation of light can occur in the passive waveguide layers, and self-absorption or scattering losses can be reduced (relative to the case where substantial propagation of light occurs in the luminescent layers 510a and 510b).

Still referring to FIG. 5, the luminescent stack 518 includes a top reflector 522 and a bottom reflector 524, which are implemented as dielectric stacks including multiple dielectric layers. Certain aspects of the luminescent stack 518 can be implemented in a similar manner as described above for the luminescent stack 500, and, therefore, are not further described herein.

In the illustrated embodiment, the pair of reflectors 522 and 524 sandwich a luminescent layer 520, such that the top reflector 522 is adjacent to a top surface of the luminescent layer 520, and the bottom reflector 524 is adjacent to a bottom surface of the luminescent layer 520. The luminescent layer 520 includes a set of luminescent materials that convert a relatively wide range of energies of solar radiation into a relatively narrow, substantially monochromatic energy band.

As illustrated in FIG. 5, a bonding layer 526 is included between the luminescent layer 520 and the bottom reflector 524, and serves to connect the luminescent layer 520 to the bottom reflector 524 via adhesion, hydrogen bonding, or inter-diffusion. While a single bonding layer 526 is illustrated in FIG. 5, it is contemplated that multiple bonding layers can be included in other implementations. In particular, a similar bonding layer can be included between the luminescent layer 520 and the top reflector 522, and can serve to connect the luminescent layer 520 to the top reflector 522.

Manufacturing Methods to Form Solar Modules

Attention next turns to FIG. 6 through FIG. 9, which illustrate manufacturing methods to form solar modules, according to certain embodiments of the invention.

Figure 6:
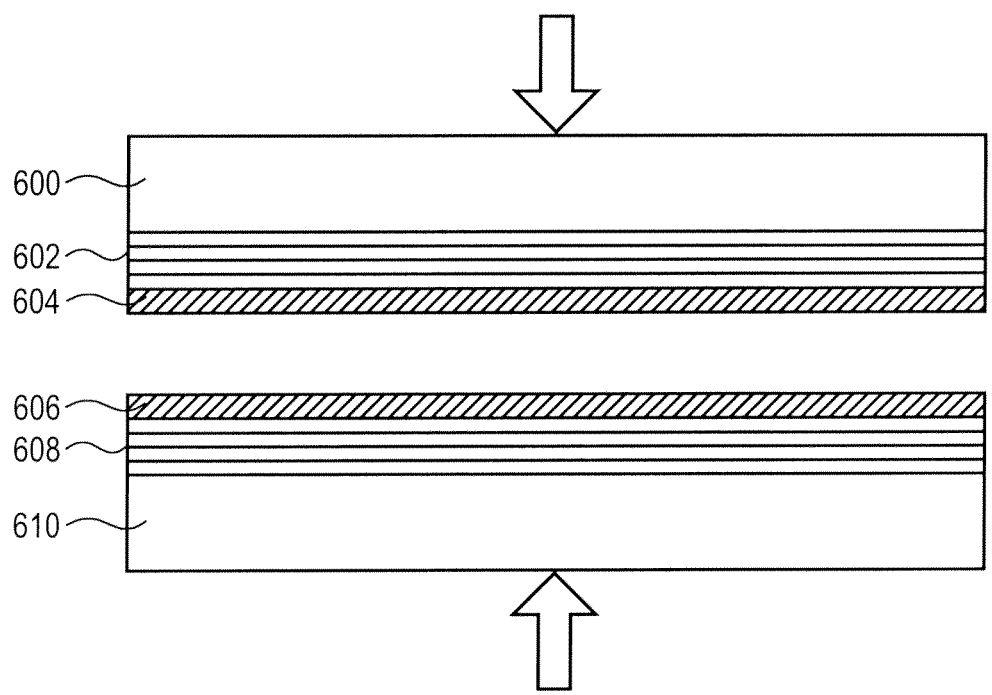
FIG. 6 through FIG. 10 illustrate manufacturing methods to form solar modules, according to certain embodiments of the invention.

Referring first to FIG. 6, a top reflector 602 and a bottom reflector 608 are formed adjacent to a top substrate layer 600 and a bottom substrate layer 610, respectively. In the illustrated embodiment, Atomic Layer Deposition ("ALD") is used to form the reflectors 602 and 608 in a single deposition run, and processing conditions can be optimized with respect to characteristics of the reflectors 602 and 608. ALD typically uses a set of reactants to form alternate, saturated, chemical reactions on a surface, resulting in self-limited growth with desirable features such as conformity, uniformity, repeatability, and precise control over thickness. ALD typically involves sequentially introducing reactants to a surface in a gas phase to form successive monolayers. Certain aspects of ALD are described in Nanu et al., "$CuInS_2$—$TiO_2$ Heterojunctions Solar Cells Obtained by Atomic Layer Deposition," Thin Solid Films, Vol. 431-432, pp. 492-496 (2003); Spiering et al., "Stability Behaviour of Cd-free Cu(In,Ga)$Se_2$ Solar Modules with $In_2S_3$ Buffer Layer Prepared by Atomic Layer Deposition," Thin Solid Films, Vol. 480-481, pp. 195-198 (2005); and Klepper et al., "Growth of Thin Films of $CO_3O_4$ by Atomic Layer Deposition," Thin Solid Films, Vol. 515, pp. 7772-7781 (2007); the disclosures of which are incorporated herein by reference in their entireties. It is contemplated that another suitable deposition technique can be used in place of, or in conjunction with, ALD to form the reflectors 602 and 608, including Physical Vapor Deposition ("PVD"), such as electron beam PVD or vacuum coating; Chemical Vapor Deposition ("CVD"); spray coating, such as thermal spraying; dip coating; web coating; and spin coating. It is also contemplated that dielectric layers corresponding to the reflectors 602 and 608 can be formed adjacent to a larger substrate layer, which is then singulated or sub-divided to form the substrate layers 600 and 610 along with the respective reflectors 602 and 608. While not illustrated in FIG. 6, buffer layers can also be formed using ALD or another suitable deposition technique.

Next, coatings or films 604 and 606 of a set of luminescent materials (or a set of reactants that are precursors of a set of luminescent materials) are formed adjacent to the top reflector 602 and the bottom reflector 608, respectively. In the illustrated embodiment, ALD processing conditions, which are optimized with respect to the reflectors 602 and 608, can be sub-optimal or incompatible with respect to the materials forming the coatings 604 and 606. As such, another deposition technique is used to form the coatings 604 and 606, and processing conditions can be optimized with respect to characteristics of the coatings 604 and 606. Desirably, the processing conditions involve moderate temperatures and pressures so as to avoid or reduce detrimental impact on resulting optical characteristics. Examples of suitable deposition techniques include PVD, such as electron beam PVD or vacuum coating; CVD; spray coating, such as thermal spraying; dip coating; web coating; and spin coating. It is contemplated that the materials forming the coatings 604 and 606 can be deposited adjacent to a larger substrate layer, which is then singulated or sub-divided to form the substrate layers 600 and 610 along with the respective coatings 604 and 606.

The coatings 604 and 606 are next subjected to bonding and annealing so as to form a substantially seamless, monolithic structure. In particular, the top assembly of layers and the bottom assembly of layers illustrated in FIG. 6 are oriented or positioned such that exposed surfaces of the coatings 604 and 606 face one another. Sufficient precision in the alignment of the top substrate layer 600 and the bottom substrate layer 610 can be desirable, particularly if a set of grooves are formed on either, or both, of the substrate layers 600 and 610. The exposed surfaces can be subjected to certain pre-treatment operations to facilitate their bonding and to enhance resulting optical characteristics. Examples of such pre-treatment operations include chemical treatment, such as to alter surface roughness or to alter hydrophobic or hydrophilic characteristics, and plasma treatment. The assemblies of layers are next subjected to vacuum conditions to remove fluid contaminants at the exposed surfaces, and the exposed surfaces are then brought into contact under suitable conditions of pressure and temperature to promote bonding and annealing.

In the illustrated embodiment, fluid pressure is applied to promote bonding of the coatings 604 and 606 with reduced instances of voids and with enhanced uniformity. This fluid pressure bonding can be accomplished by sealing the assembly of layers within a chamber, and then subjecting the assembly of layers to a pressurized gas or liquid so as to apply an isostatic pressure in the range of about 1 atmosphere ("atm") to about 70 atm. Certain aspects of fluid pressure bonding are described in U.S. Pat. No. 6,946,360, entitled "Fluid Pressure Bonding" and issued on Sep. 20, 2005; U.S. Pat. No. 6,482,742, entitled "Fluid Pressure Imprint Lithography" and issued on Nov. 19, 2002; U.S. Pat. No. 7,322,287, entitled "Apparatus for Fluid Pressure Imprint Lithography" and issued on Jan. 29, 2008; and Gao et al., "Air Cushion Press for Excellent Uniformity, High Yield, and Fast Nanoimprint Across a 100 mm Field," Nano Letters, Vol. 6, No. 11 pp. 2438-2441 (2006); the disclosures of which are incorporated herein by reference in their entireties. It is contemplated that another suitable bonding technique can be used, such as using a mechanical press.

Thermal energy can be applied during or subsequent to bonding to promote annealing of the coatings 604 and 606. In the illustrated embodiment, thermal energy is applied during bonding such that bonding and annealing can be accomplished in a single run. In particular, the assembly of layers can be subjected to a heated and pressurized gas or liquid so as to apply a heating temperature in the range of about 50° C. to about 500° C., such as in the range of about 200° C. to about 300° C. It is contemplated that another suitable heating technique can be used to apply thermal energy via conduction, convection, or radiation heating, such as using resist heating or lamp heating. It is also contemplated that thermal energy can be applied in accordance with fast heating cycles to yield rapid thermal annealing. The bonded and annealed assemblies of layers are then cooled, such as in accordance with a fast cooling cycle, to yield a solar module.

In the case that the coatings 604 and 606 are formed from a set of luminescent materials, application of pressure and thermal energy can promote non-reactive bonding of the coatings 604 and 606, such as via inter-diffusion, and annealing to yield a substantially monolithic luminescent layer. In the case that the coatings 604 and 606 are formed from a set of precursors, application of pressure and thermal energy can promote reactive bonding of the coatings 604 and 606, such as via reaction of the precursors, and annealing to yield a substantially monolithic luminescent layer including a set of resulting luminescent materials. For example, the coatings 604 and 606 can be formed from respective ones of source(B) and source(A, X), and application of pressure and thermal energy can promote reaction according to formula (II) to yield a luminescent layer including a luminescent material according to formula (I). As another example, the coatings 604 and 606 can be formed from respective ones of Cd and Te (or Se), and application of pressure and thermal energy can promote reaction to yield a luminescent layer including CdTe (or CdSe). As a further example, the coatings 604 and 606 can be formed from respective ones of In and Se, and application of pressure and thermal energy can promote reaction to yield a luminescent layer including InSe. More generally, the coatings 604 and 606 can be formed from respective elemental precursors, and application of pressure and thermal energy can promote reaction to yield a luminescent layer including a binary, ternary, or higher order alloy of those elemental precursors. Bonding via inter-diffusion or reaction can allow for a certain extent of surface roughness of the coatings 604 and 606, without significant detrimental impact on resulting optical characteristics. For certain implementations, bonding, such as via reaction, can be aided by the introduction of an inert or reactive gas, before exposed surfaces are brought into contact.

The manufacturing method described with reference to FIG. 6 provides a number of benefits. In particular, a substantially monolithic structure can be formed in which different layers are formed using respective deposition techniques that are optimized with respect to those layers. Also, the manner of bonding and annealing can avoid or reduce damage to surfaces and interfaces between the layers, thereby enhancing optical characteristics. Moreover, bonding and annealing can be carried out so as to provide protection and sealing of a luminescent material and to reduce its exposure to oxygen, humidity, and other contaminants, thereby enhancing reliability of the resulting solar module.

Figure 7:
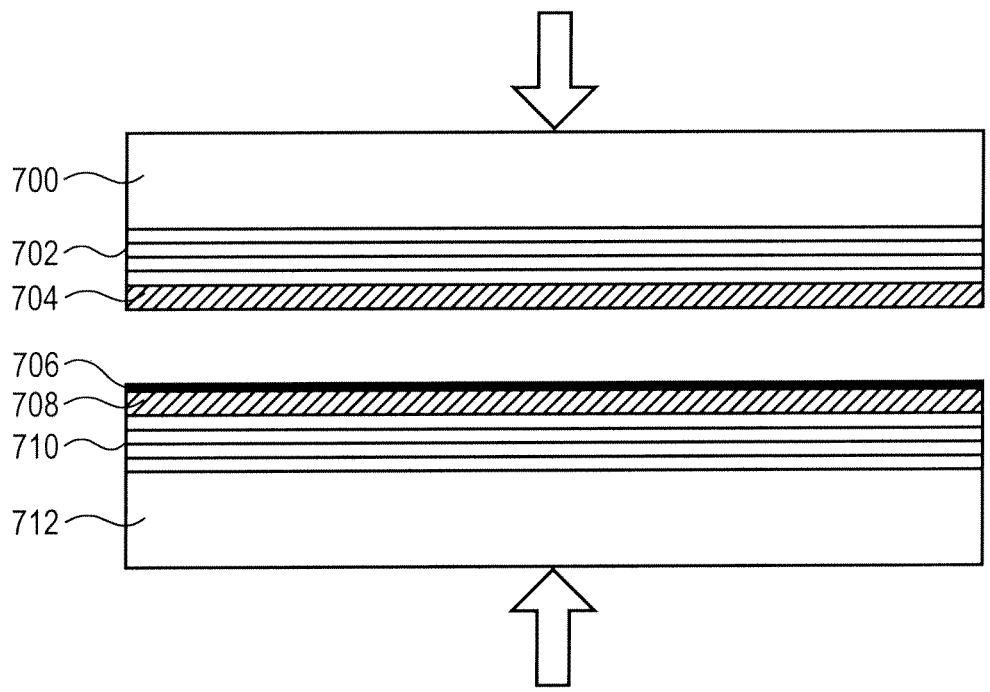

Referring next to FIG. 7, a top reflector 702 and a bottom reflector 710 are formed adjacent to a top substrate layer 700 and a bottom substrate layer 712, respectively, and a top luminescent layer 704 and a bottom luminescent layer 708 are formed adjacent to the top reflector 702 and the bottom reflector 710, respectively. Certain aspects of the manufacturing method of FIG. 7 can be implemented in a similar manner as described above for FIG. 6, and, therefore, are not further described herein.

As illustrated in FIG. 7, a coating or film 706 of an adhesive or bonding material is formed adjacent to the bottom luminescent layer 708 by applying the adhesive or bonding material using any suitable deposition technique. Use of the coating 706 can allow for a certain extent of surface roughness of the top luminescent layer 704 and the bottom luminescent layer 708 as well as more moderate temperatures and pressures during bonding and annealing. Alternatively, or in conjunction, it is contemplated that a similar coating of an adhesive or bonding material can be formed adjacent to the top luminescent layer 704. Next, the top assembly of layers and the bottom assembly of layers illustrated in FIG. 7 are subjected to bonding and annealing so as to form a substantially seamless, monolithic structure in which the top luminescent layer 704 and the bottom luminescent layer 708 are connected via a resulting bonding layer. It is also contemplated that bonding can be accomplished using an ultraviolet light-curable adhesive or bonding material, rather than a thermal-curable adhesive or bonding material. For example, a thin coating of a pre-polymer (or a set of monomers) can be applied to a set of surfaces, and, after the surfaces are pressed together, ultraviolet light exposure can be applied through either, or both, of the surfaces to cure the pre-polymer (or the monomers) to form a resulting bonding layer.

Figure 8:
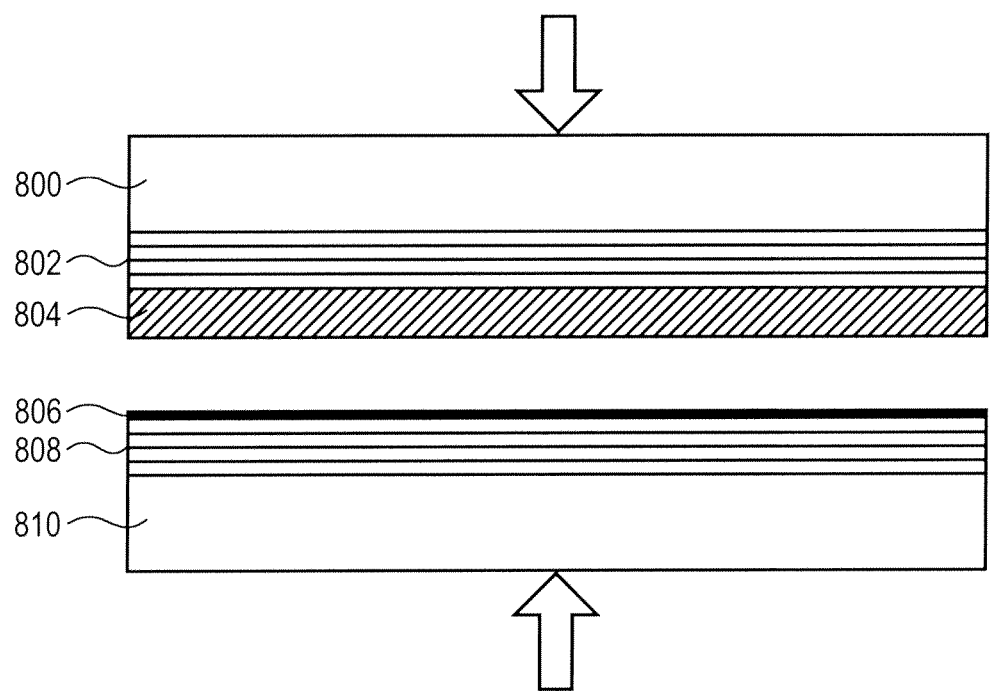

Turning next to FIG. 8, a top reflector 802 and a bottom reflector 808 are formed adjacent to a top substrate layer 800 and a bottom substrate layer 810, respectively, and a luminescent layer 804 is formed adjacent to the top reflector 802. Certain aspects of the manufacturing method of FIG. 8 can be implemented in a similar manner as described above for FIG. 6, and, therefore, are not further described herein.

As illustrated in FIG. 8, a coating or film 806 of an adhesive or bonding material is formed adjacent to the bottom reflector 808 using any suitable deposition technique. Alternatively, or in conjunction, it is contemplated that a similar coating of an adhesive or bonding material can be formed adjacent to the luminescent layer 804. Next, the top assembly of layers and the bottom assembly of layers illustrated in FIG. 8 are subjected to bonding and annealing so as to form a substantially seamless, monolithic structure in which the luminescent layer 804 and the bottom reflector 808 are connected via a resulting bonding layer.

Figure 9:
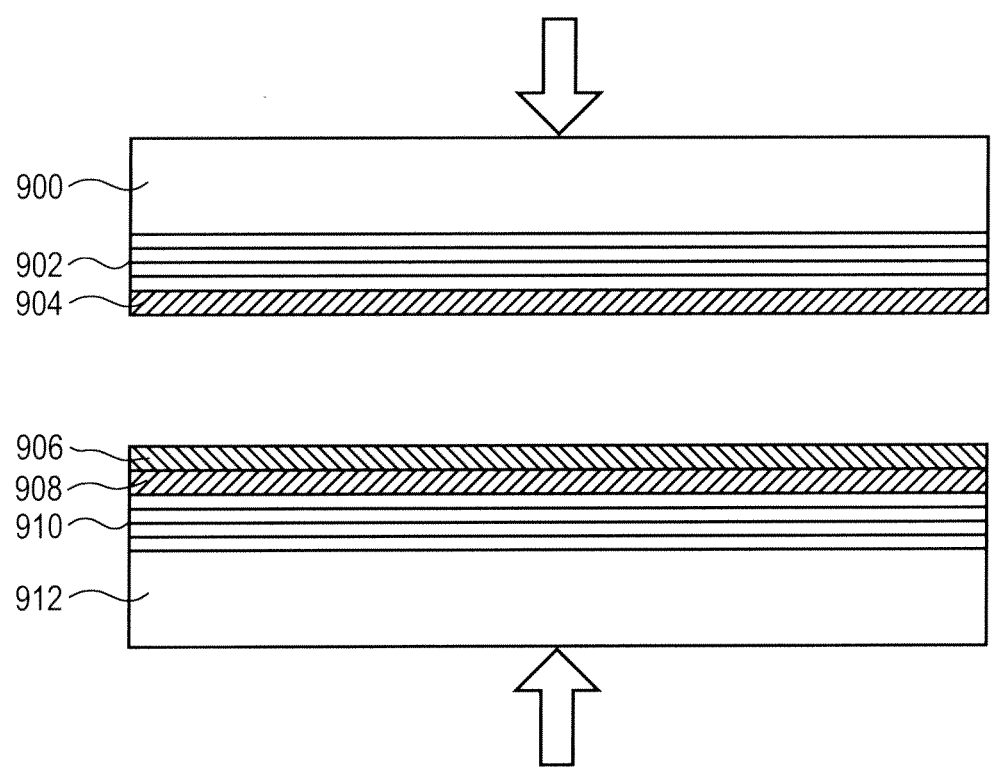

Referring to FIG. 9, a top reflector 902 and a bottom reflector 910 are formed adjacent to a top substrate layer 900 and a bottom substrate layer 912, respectively. Certain aspects of the manufacturing method of FIG. 9 can be implemented in a similar manner as described above for FIG. 6, and, therefore, are not further described herein.

Next, a coating or film 904 of a set of precursors is formed adjacent to the top reflector 902, and coatings or films 906 and 908 of a set of precursors are formed on top of one another and adjacent to the bottom reflector 910. It is contemplated that more or less coatings can be formed adjacent to the top reflector 902 and the bottom reflector 910. The top assembly of layers and the bottom assembly of layers illustrated in FIG. 9 are then subjected to bonding and annealing so as to form a substantially seamless, monolithic structure in which a resulting luminescent layer is sandwiched by the top reflector 902 and the bottom reflector 910. For example, the coatings 904 and 908 can be formed from source(B), the coating 906 can be formed from source(A, X), and application of pressure and thermal energy can promote reaction at interfaces between the coatings 904, 906, and 908 according to formula (II) to yield a luminescent material according to formula (I). As another example, the coatings 904 and 908 can be formed from source(A, X), the coating 906 can be formed from source(B), and application of pressure and thermal energy can promote reaction at the interfaces according to formula (II) to yield a luminescent material according to formula (I). As a further example, the coatings 904 and 908 can be formed from In, the coating 906 can be formed from Se, and application of pressure and thermal energy can promote reaction at the interfaces to yield InSe.

In the illustrated embodiment, relative amounts or thicknesses of the coatings 904, 906, and 908 are adjusted or controlled such that the resulting luminescent layer has a spatially varying index of refraction, thereby yielding a graded index waveguide structure. For example, the luminescent layer can include substantially unreacted precursors having one index of refraction and located at interfaces with the top reflector 902 and the bottom reflector 910, and can include substantially reacted precursors having another index of refraction and sandwiched by the substantially unreacted precursors. As another example, the luminescent layer can include substantially reacted precursors having one index of refraction and located at the interfaces with the top reflector 902 and the bottom reflector 910, and can include substantially unreacted precursors having another index of refraction and sandwiched by the substantially reacted precursors. Use of a graded index waveguide structure can enhance an efficiency at which emitted radiation is guided towards a PV cell, such as by reducing scattering losses caused by abrupt changes in index of refraction and reducing modal and polarization dispersion of guided optical modes.

Figure 10:
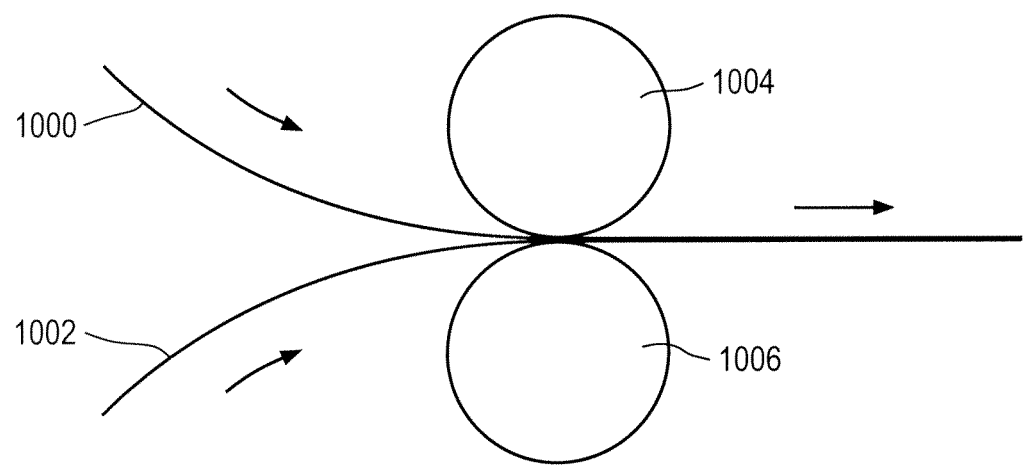

It should be recognized that the embodiments of the invention described above are provided by way of example, and various other embodiments are encompassed by the invention. For example, step-and-repeat techniques or roll-to-roll techniques can be used to form solar modules in which various layers are subjected to pressure and energy using a heated mechanical press or by passing through heated rolls. In the case of flexible substrate layers, such as those formed from a plastic or a thin metal foil, a roll-to-roll coating and bonding technique can be used, such as illustrated in the embodiment of FIG. 10. A top substrate layer 1000 and a bottom substrate layer 1002 can be coated using two parallel roll-to-roll processes, and then bonded using another roll-to-roll process by passing through a set of rollers 1004 and 1006 and applying a form of energy, such as thermal energy or ultraviolet light.

Alternatively, or in conjunction, various layers can be laminated onto substrate layers, rather than deposited onto the substrate layers. As another example, the manufacturing methods described herein can be adapted to form a hollow waveguide structure in which conveyance of emitted radiation occurs within a cavity defined by the waveguide structure. This cavity can be formed by depositing a sacrificial layer interspersed among other layers, such as a set of reflectors and a set of luminescent layers, and then substantially removing the sacrificial layer via sublimation, organic pyrolysis, dissolution, or another suitable technique.

A practitioner of ordinary skill in the art requires no additional explanation in developing the solar modules described herein but may nevertheless find some helpful guidance regarding the formation and processing of PV cells by examining the following references: U.S. Pat. No. 7,169,669, entitled "Method of Making Thin Silicon Sheets for Solar Cells" and issued on Jan. 30, 2007; and U.S. Patent Application Publication No. 2005/0272225, entitled "Semiconductor Processing" and published on Dec. 8, 2005, the disclosures of which are incorporated herein by reference in their entireties. A practitioner of ordinary skill in the art may also find some helpful guidance regarding spectral concentration by examining the following references: U.S. Pat. No. 4,227,939, entitled "Luminescent Solar Energy Concentrator Devices" and issued on Oct. 14, 1980; and A. H. Zewali, "Photon Trapping and Energy Transfer in Multiple-Dye Plastic Matrices: an Efficient Solar-Energy Concentrator;" Optics Letters, Vol. 1, p. 73 (1977), the disclosures of which are incorporated herein by reference in their entireties. Also, a practitioner of ordinary skill in the art may find some helpful guidance regarding multi-junction solar modules by examining Barnham et al., "Quantum-dot Concentrator and Thermodynamic Model for the Global Redshift," Applied Physics Letters, Vol. 76, No. 9, pp. 1197-1199 (2000), the disclosure of which is incorporated herein by reference in its entirety. Furthermore, a practitioner of ordinary skill in the art may find some helpful guidance regarding resonant cavity effects and related structures by examining the co-pending and co-owned U.S. patent application Ser. No. 12/144,548, entitled "Solar Modules with Enhanced Efficiencies via Use of Spectral Concentrators" and filed on Jun. 23, 2008, the disclosure of which is incorporated herein by reference in its entirety.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A method of forming a solar module, comprising:
providing a first assembly of layers, the first assembly of layers including a first substrate layer, a first reflector on the first substrate layer, and a first coating directly on the first reflector, the first coating corresponding to a luminescent material and including a first surface facing away from the first reflector;
providing a second assembly of layers, the second assembly of layers including a second substrate layer, a second reflector on the second substrate layer, and a second coating directly on the second reflector, the second coating corresponding to the luminescent material and including a second surface facing away from the second reflector;
positioning the first assembly of layers and the second assembly of layers such that the first surface of the first coating and the second surface of the second coating face one another;
bonding the first coating and the second coating to form a luminescent layer, the luminescent layer including the luminescent material and positioned between the first reflector and the second reflector to form a spectral concentrator; and
optically coupling a photovoltaic cell to a side surface of the spectral concentrator.

2. The method of claim 1, wherein providing the first assembly of layers includes forming the first reflector on the first substrate layer, and providing the second assembly of layers includes forming the second reflector on the second substrate layer.

3. The method of claim 2, wherein at least one of forming the first reflector and forming the second reflector is carried out by atomic layer deposition of a set of dielectric materials.

4. The method of claim 1, wherein providing the first assembly of layers includes forming the first coating directly on the first reflector by deposition of the luminescent material, and providing the second assembly of layers includes forming the second coating directly on the second reflector by deposition of the luminescent material.

5. The method of claim 4, wherein bonding the first coating and the second coating is carried out by applying pressure and thermal energy to promote inter-diffusion between the first coating and the second coating.

6. The method of claim 1, wherein providing the first assembly of layers includes forming the first coating directly on the first reflector by deposition of a first precursor of the luminescent material, providing the second assembly of layers includes forming the second coating directly on the second reflector by deposition of a second precursor of the luminescent material, and bonding the first coating and the second coating is via reaction between the first precursor and the second precursor of the luminescent material.

7. The method of claim 6, wherein bonding the first coating and the second coating is carried out by applying pressure and thermal energy to promote reaction between the first precursor and the second precursor to form the luminescent material.

8. The method of claim 7, wherein the first precursor is a source of B, the second precursor is a source of A and X, B is selected from elements of Group IVB, A is selected from elements of Group IA, and X is selected from elements of Group VIIB.

9. The method of claim 8, wherein the first precursor has the formula $BY_2$, the second precursor has the formula AX, B is selected from germanium, tin, and lead, Y is selected from chlorine, bromine, and iodine, A is selected from potassium, rubidium, and cesium, and X is selected from chlorine, bromine, and iodine.

10. The method of claim 8, wherein the luminescent material has the formula $A_aB_bX_x$, where a is 1, b is in the range of 1 to 5, and x is 1+2b.

11. The method of claim 7, wherein the first precursor includes a first elemental precursor, the second precursor includes a second elemental precursor, and the luminescent material includes an alloy of the first elemental precursor and the second elemental precursor.

* * * * *